(12) United States Patent
Garrity

(10) Patent No.: US 8,736,309 B2
(45) Date of Patent: May 27, 2014

(54) NON-OVERLAPPING CLOCK GENERATOR CIRCUIT AND METHOD

(75) Inventor: Douglas A. Garrity, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 166 days.

(21) Appl. No.: 13/479,319

(22) Filed: May 24, 2012

(65) Prior Publication Data

US 2013/0314126 A1    Nov. 28, 2013

(51) Int. Cl.
*H03K 19/096* (2006.01)
*G06F 1/04* (2006.01)

(52) U.S. Cl.
USPC ............................. 326/93; 327/294; 375/280

(58) Field of Classification Search
None
See application file for complete search history.

(56) References Cited

U.S. PATENT DOCUMENTS

| | | | |
|---|---|---|---|
| 5,341,031 A * | 8/1994 | Kinoshita et al. | 327/259 |
| 5,410,263 A * | 4/1995 | Waizman | 327/141 |
| 5,574,457 A | 11/1996 | Garrity et al. | |
| 5,818,276 A | 10/1998 | Garrity et al. | |
| 5,886,562 A | 3/1999 | Garrity et al. | |
| 7,064,700 B1 | 6/2006 | Garrity et al. | |
| 7,459,952 B2 * | 12/2008 | Ogita | 327/239 |
| 7,649,957 B2 * | 1/2010 | Garrity et al. | 375/280 |
| 8,217,824 B2 * | 7/2012 | Hernes et al. | 341/161 |
| 8,487,683 B1 * | 7/2013 | Krishna et al. | 327/239 |
| 8,487,803 B1 * | 7/2013 | Garrity | 341/161 |

OTHER PUBLICATIONS

Lewis et al.; "A 10-b 20-Msample/s Analog-to-Digital Converter"; IEEE Journal of Solid-State Circuits; Mar. 1992, pp. 351-358; vol. 27, No. 3; IEEE.

* cited by examiner

*Primary Examiner* — Alexander H Taningco
*Assistant Examiner* — Nelson Correa
(74) *Attorney, Agent, or Firm* — The Mason Group Patent Specialists LLC; Valerie M. Davis

(57) ABSTRACT

A non-overlapping clock generator circuit supplies clock signals to a stage of a pipelined ADC, which includes parallel switched capacitor circuitry. The non-overlapping clock generator circuit includes: a first trigger generation circuit that generates first and second trigger signals; a second trigger generation circuit that generates third and fourth trigger signals; a first clock generation branch that receives the first, second and fourth trigger signals and generates first sampling cycle and delayed sampling cycle clock signals; a second clock generation branch that receives the first, second and third trigger signals and generates second sampling cycle and delayed sampling cycle clock signals; a third clock generation branch that receives the second trigger signal and generates first gain cycle and delayed gain cycle clock signals; and a fourth clock generation branch that receives the first trigger signal and generates second gain cycle and delayed gain cycle clock signals.

20 Claims, 8 Drawing Sheets

NON-OVERLAPPING CLOCK GENERATOR CIRCUIT AND METHOD

RELATED APPLICATIONS

The present application is related to the following U.S. application commonly owned with this application by Freescale Semiconductor, Inc.: Ser. No. 13/355,657, filed Jan. 23, 2012, titled "Pipelined Analog-to-Digital Converter Having Reduced Power Consumption", the entire contents of which are being incorporated herein by reference.

FIELD

The present disclosure relates generally to analog-to-digital conversion and more particularly to a method and circuit for non-overlapping clock generation.

BACKGROUND

Clock generation circuits can be used to clock synchronous circuits, such as analog-to-digital converters (ADCs). A clock generation circuit provides one or more repetitive clock signals, each having a constant period, also referred to herein as periodic signals. When used to clock switched capacitor circuits within an analog-to-digital converter, the clock generation circuit generates non-overlapping clock signals to reduce charge transfer induced errors in the output voltage of a switched capacitor circuit.

Two clock signals are non-overlapping with respect to each other if only one of the clock signals is high at any given time. In other words, if two non-overlapping clock signals are viewed on the same time axis, the repetitive clock pulses of the respective signals never overlap and are always separated, in time, from one another.

As analog-to-digital converter technology improves, clock generation circuits must be developed to generate the required non-overlapping clock signals used by the switched capacitor circuits within the analog-to-digital converters.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
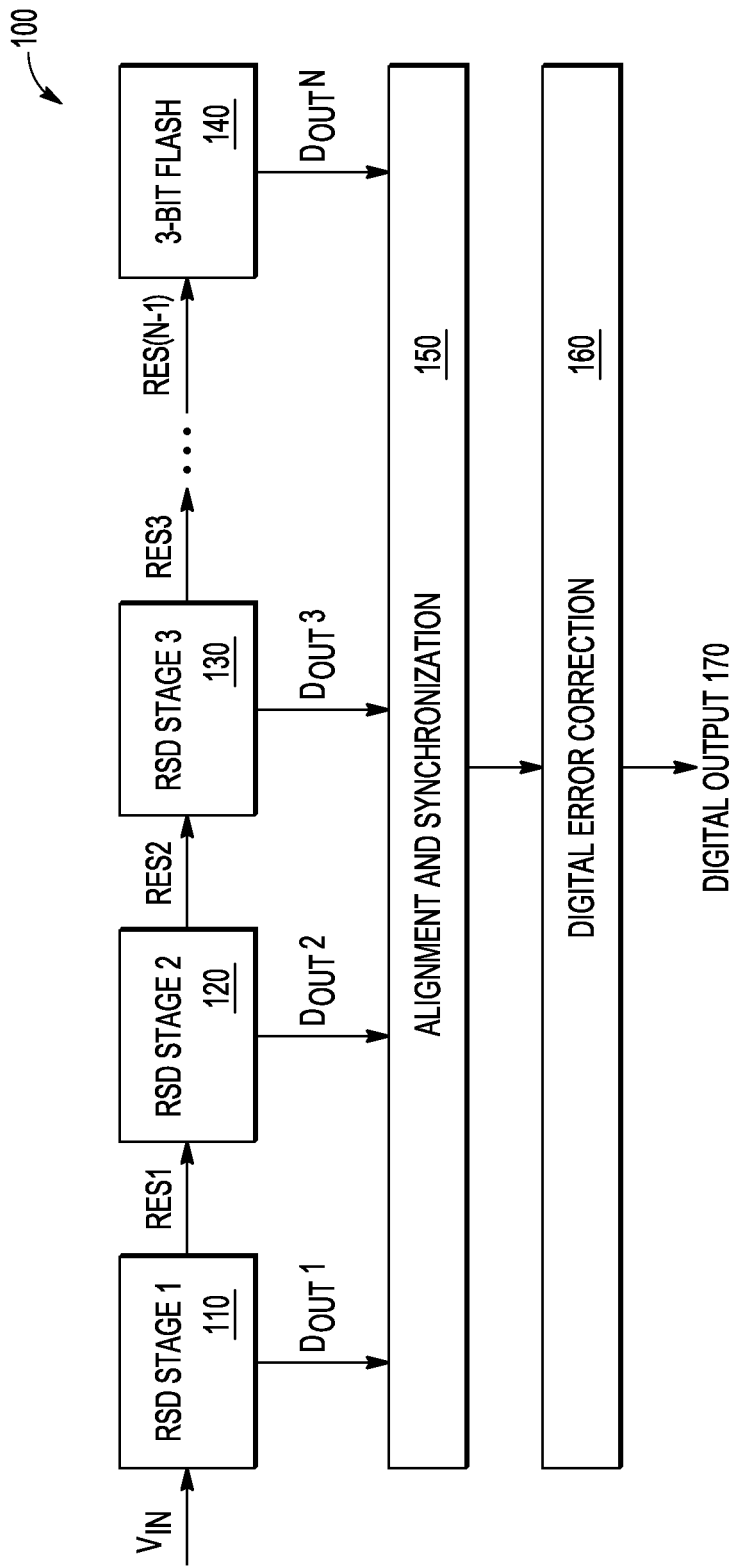
FIG. 1 is a generalized block diagram illustrating a pipelined ADC, in accordance with an embodiment.

The present invention is illustrated by way of example, and its not limited by the accompanying figures, in which like references indicate similar elements. Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

In accordance with an embodiment is a non-overlapping clock generator circuit architecture that supplies clock signals having needed clock timing relationships to, for instance, an initial stage of a pipelined ADC or a middle stage of a pipelined ADC as described in U.S. application Ser. No. 13/355,657, despite process, supply, or temperature variations. This novel pipelined ADC has advantages of both a high input sample rate as well as low power consumption due to having all but the initial pipeline stage to operate at a frequency that is a fraction of the input sample rate. The initial stage of this novel pipelined ADC has an internal operating frequency that is the full ADC sample rate, and samples an input signal on the same clock edge for each sample; however, subsequent middle pipeline stages have parallel input sampling circuitry and can, therefore, sample input signals provided by a preceding stage at a reduced rate. This results in a reduced operating frequency of the input sampling circuitry for these middle stages, which provides reduction in power consumption by those stages.

For the sake of brevity, conventional techniques related to switched capacitor circuits, ADC architectures, voltage comparator circuits, digital logic circuits, and other functional aspects of the system (and the individual system operating components) may not be described in detail. Furthermore, the connecting lines shown in the various figures contained herein are intended to represent example functional relationships and/or physical couplings between the various elements. It should be noted that many alternative or additional functional relationships or physical connections may be present in a practical embodiment. In addition, for ease of discussion, FIG. 1 and FIG. 2 illustrate example single-ended implementations of pipelined ADCs and pipelined ADC stages, but those skilled in the art can adapt illustrated techniques for use in differential signaling applications using the provided guidelines without departing from the scope of the present disclosure.

Figure 2:
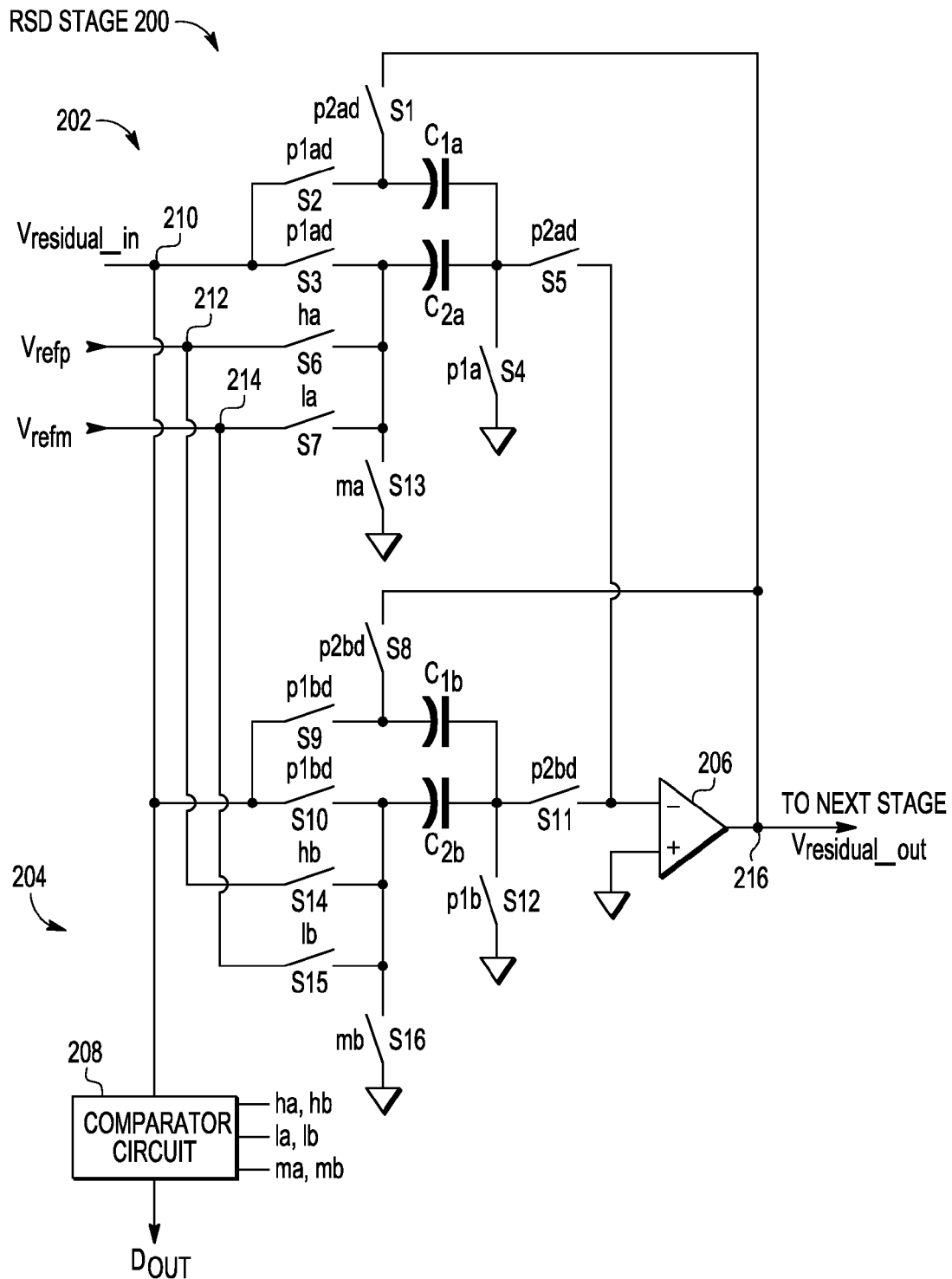
FIG. 2 is a circuit diagram illustrating a middle stage of the pipelined ADC shown in FIG. 1, in accordance with an embodiment.

FIG. 1 is a block diagram illustrating a generalized pipelined ADC 100 in accordance with an embodiment, as described in U.S. application Ser. No. 13/355,657, which is incorporated herein by reference. However, some description of this novel pipelined ADC is provided here for the sake of clarity when describing the non-overlapping clock generating circuit (in accordance with the present disclosure) that can be used to provide the various clock signals used in operating the ADC. As illustrated, ADC 100 includes a plurality of redundant signed digit (RSD) stages (RSD stage 1 (110), RSD stage 2 (120), and RSD stage 3 (130)) and a multi-bit (e.g., 3-bit) flash ADC stage 140. The pipelined ADC 100 samples an analog signal (Vin) at a specified clock rate, and generates a digital output signal (170) corresponding to a voltage magnitude of each sampled signal. Resolution or accuracy of the pipelined ADC is a function of the resolution of each individual stage and the number of ADC stages used. Each ADC stage provides at least one bit of resolution, starting with the most significant bit (MSB) for the stage (110) (e.g., $D_{OUT}1$), proceeding with bits generated by additional stages (e.g., $D_{OUT}2$ and $D_{OUT}3$) and ending with the least significant bits from the last or final stage (140) (e.g., $D_{OUT}N$).

The overall speed of operation of ADC 100 is related to the speed of the series of ADC stages in the pipeline. Each ADC stage relies on the results (e.g., Res1, Res2, Res3, Res(N−1)) of any preceding ADC stage before generating a digital signal. All but the final ADC stage (e.g., 140) includes circuitry comprising a switched capacitor circuit and at least one comparator. If such an arrangement includes two comparators, it is known as a 1.5 bit ADC stage. The final ADC stage comprises a series of comparators with differing threshold voltages used to convert the analog signal to a digital output. Where the pipeline stage is the first or "initial" stage (e.g., stage 110), the switched capacitor circuit of the ADC stage amplifies the sampled Vin and adds or subtracts a reference voltage or 0V. In the "middle" stages of the ADC 100 (i.e., all stages, for instance 120 and 130, between the initial stage 110 and the final stage 140), the switched capacitor circuit of the ADC stage amplifies a voltage (received from a preceding ADC stage) and adds or subtracts a reference voltage or 0V depending upon the magnitude of the input voltage in order to generate another voltage, referred to herein as a residual or residue voltage. As used herein, the residual voltage generated by the initial stage of the ADC 100 is called an initial stage residual voltage, and the residual voltage generated by a middle stage of the ADC 100 is called a middle stage residual voltage.

Since the bits from each stage are determined at different points in time as the sample residues pass through the pipeline, all of the bits corresponding to the same sample are time aligned using, for example, shift registers in an alignment and synchronization logic block 150. The digital representation of the analog input Vin is then passed to digital error correction logic 160. Digital error correction logic 160 is configured to correct for errors generated by comparators at any stage except for the final stage in the pipelined ADC. In addition, logic blocks 150 and 160 can perform other digital processing prior to generating digital output 170. Digital output from the pipelined ADC is provided at the sample rate of the ADC, with a delay for processing by each stage of the pipeline.

As mentioned above, the initial stage (e.g., 110) of the pipelined ADC has an internal operating frequency that is the full ADC sample rate, and it samples the input signal Vin on the same clock edge for each sample. However, subsequent middle stages in accordance with the teachings of U.S. application Ser. No. 13/355,657 have parallel input sampling circuitry and can, therefore, sample input signals provided by a preceding stage at a reduced rate. FIG. 2 is a circuit diagram 200 illustrating architecture of a middle stage of a pipelined ADC described in U.S. application Ser. No. 13/355,657, such as the pipelined ADC 100 shown in FIG. 1, which uses the clock signals and clock signal timing relationships described below by reference to FIG. 3 to FIG. 6. In accordance with another embodiment, the circuit diagram 200 is used as an initial stage of a pipelined ADC, which uses the clock signals and clock signal timing relationships described by reference to FIG. 3 to FIG. 6. Thus, although the remaining drawings are described by reference to circuit 200 being a middle stage, the description is equally applicable (with some noted exceptions) to a pipelined ADC having circuit 200 as the initial stage.

RSD stage 200 comprises a plurality of switched capacitor circuits, e.g., 202 and 204 that share an operational amplifier 206, and further includes a comparator circuit 208. By utilizing multiple switched capacitor circuits, the overall sample frequency of the pipelined ADC can be maintained, but with the circuitry of each switched capacitor circuit within the middle stage functioning at a fraction of the overall sample frequency for that RSD stage. As illustrated in FIG. 2, RSD stage 200 includes two switched capacitor circuits 202 and 204 that share the amplifier 206, which operates at half the overall sample frequency of the ADC. Accordingly, each switched capacitor circuit coupled to the amplifier 206 also operates at half the sample frequency of the ADC; however, the RSD stage 200 itself processes required signals at the overall sample frequency of the ADC, as will become more evident below. By virtue of having X number of switched capacitor circuits within the middle stage, each switched capacitor circuit, thereby, has a sampling frequency of 1/X that of the initial stage of the pipelined ADC.

More particularly, switched capacitor circuit 202 (also referred to herein as a first switched capacitor circuit of, or within, the RSD stage 200) comprises a capacitor $C_{1a}$ and a capacitor $C_{2a}$, wherein the two capacitors are generally set to the same capacitance value. Switched capacitor circuit 202 further comprises a set of sampling cycle control switches S2, S3, and S4 and a set of gain cycle control switches S1, S5, S6, S7, and S13. Components and signals associated with switched capacitor circuit 202 are labeled with the letter "a". Similarly, switched capacitor circuit 204 (also referred to herein as a second switched capacitor circuit of, or within, the RSD stage 200) comprises a capacitor $C_{1b}$ and a capacitor $C_{2b}$, wherein the two capacitors are generally set to the same capacitance value. Switched capacitor circuit 204 further comprises a set of sampling cycle control switches S9, S10, and S12 and a set of gain cycle control switches S8, S11, S14, S15, and S16. Components and signals associated with switched capacitor circuit 204 are labeled with the letter "b". As used herein, sampling cycle control switches are switches that are or can be closed using a requisite signal to configure or reconfigure the switched capacitor circuit during a sampling cycle of the circuit. Gain cycle control switches are switches that are or can be closed using a requisite signal to configure or reconfigure the switched capacitor circuit during a gain cycle of the circuit. The switches comprising RSD stage 200 can be implemented using any suitable transistor technology including, but not limited to, MOSFET (metal-oxide semiconductor field effect transistor) technology.

RSD stage 200 receives an input signal Vresidual_in at a node 210, which is the residual or residual voltage passed from the immediately preceding pipeline stage. Further, a first reference node 212 is provided for receiving a first reference voltage Vrefp, and a second reference node 214 is provided for receiving a second reference voltage Vrefm. Vrefp and Vrefm can be the same as those used in other pipeline stages (such as the initial stage of the ADC), or they can be different. An output node 216 provides, to the next pipeline stage, a middle stage residual voltage Vresidual_out derived from and based on the input voltage signal received at node 210.

Operation of RSD stage 200 is briefly described as follows. The switches in RSD stage 200 are controlled by clock signals p1a, p1ad, p1b, p1bd, p2ad, and p2bd shown in FIG. 3 to FIG. 6 and by switch control signals la, ma, ha, lb, mb, and hb generated and provided by comparator circuit 208. The switches are labeled with their respective governing clock signal or control signal. During operation, when a clock or control signal is "high", the associated switch is closed; and when a clock or control signal is "low", the associated switch is open.

The switched capacitor circuits 202 and 204 operate at alternating sampling cycle times. For example, during the sampling cycle of the switched capacitor circuit 202, when sampling cycle clock signals p1a and p1ad are high (and sampling cycle clock signals p1b and p1bd are low), switches S2, S3, and S4 are closed, and capacitors C1a and C2a sample the input voltage applied to input node 210. Alternately, during the sampling cycle of the switched capacitor circuit 204, when clock signals p1b and p1bd are high (and clock signals p1a and p1ad are low), switches S9, S10, and S12 are closed, and capacitors C1b and C2b sample the input voltage applied to input node 210. As used herein, a sampling cycle clock signal is a clock signal that can be supplied to control (in this instance to open and close) sampling cycle control switches within a switched capacitor circuit.

Accordingly, and as partially illustrated by reference to FIG. 3, sampling cycle clock signal p1a (and the delayed sampling cycle clock signal p1ad) are non-overlapping with respect to sampling cycle clock signal p1b (and the delayed sampling cycle clock signal p1bd). In other words, each pulse of the sampling cycle clock signals p1a and p1ad has a rising edge and a falling edge that occur between and at different times from a falling edge of pulses of sampling cycle clock signals p1b and p1bd and a rising edge of next pulses of sampling cycle clock signals p1b and p1bd. Maintaining this non-overlapping sampling cycle clock signal arrangement ensures that the switched capacitor circuits 202 and 204 never concurrently sample the input voltage appearing at the node 210.

Additionally, during the respective sampling cycle of each switched capacitor circuit, the comparator circuit 208 compares the input voltage received at node 210 against at least one reference voltage and generates a corresponding logic level (e.g., −1, 1, or 0) that determines a digital output $D_{OUT}$ for the RSD stage 200 and that correspondingly sets the control signal (ha, hb, la, lb, ma, or mb) used to close the appropriate gain cycle control switch of the switched capacitor circuit, in order to output the appropriate residual voltage Vresidual_out, at node 216. In one illustrative embodiment, the comparator circuit 208 includes two comparators for comparing Vresidual_in against two reference voltage levels, VH and VL, to generate the corresponding logic level, digital output and control signal.

Moreover, the switched capacitor circuits 202 and 204 operate at alternating gain cycle times. For example, during the gain cycle of the switched capacitor circuit 202, when gain cycle clock signals p2a and p2ad are high (and gain cycle clock signals p2b and p2bd are low), switches S1 and S5 are closed. Closing these switches effectively multiplies (i.e., provides "gaining" to) the input voltage at node 210 by an amount (Gvi) determined by the capacitance values of C1a and C2a (in this case by a factor of 2, wherein Gvi=(1+C2a/C1a)). During the gain cycle, the signal processing applied to Vresidual_in to generate Vresidual_out depends on the control signal supplied by the comparator circuit 208. More particularly, when the comparator circuit 208 outputs control signal la based on its voltage comparison function, this closes switch S7 resulting in a Vresidual_out (in this example embodiment) of (2×Vresidual_in+Vrefm). When the comparator circuit 208 outputs control signal ha based on its voltage comparison function, this closes switch S6 resulting in a Vresidual_out (in this example embodiment) of (2×Vresidual_in−Vrefp). Otherwise, when the comparator circuit 208 outputs control signal ma based on its voltage comparison function, this closes switch S13 resulting in a Vresidual_out (in this example embodiment) of (2×Vresidual_in).

Alternately, during the sampling cycle of the switched capacitor circuit 204, when clock signals p2b and p2bd are high (and clock signals p2a and p2ad are low), switches S8 and S11 are closed. Closing these switches effectively multiplies (i.e., provides "gaining" to) the input voltage at node 210 by an amount (Gvi) determined by the capacitance values of C1b and C2b (in this case by a factor of 2, wherein Gvi=(1+C2b/C1b)). During the gain cycle, the signal processing applied to Vresidual_in to generate Vresidual_out depends on the control signal supplied by the comparator circuit 208. More particularly, when the comparator circuit 208 outputs control signal lb based on its voltage comparison function, this closes switch S15 resulting in a Vresidual_out (in this example embodiment) of (2×Vresidual_in+Vrefm). When the comparator circuit 208 outputs control signal hb based on its voltage comparison function, this closes switch S14 resulting in a Vresidual_out (in this example embodiment) of (2×Vresidual_in−Vrefp). Otherwise, when the comparator circuit 208 outputs control signal mb based on its voltage comparison function, this closes switch S16 resulting in a Vresidual_out (in this example embodiment) of (2×Vresidual_in).

Accordingly, and as partially illustrated by reference to FIG. 3, gain cycle clock signal p2a (and the delayed gain cycle clock signal p2ad) are non-overlapping with respect to gain cycle clock signal p2b (and the delayed gain cycle clock signal p2bd). In other words, each pulse of the gain cycle clock signals p2a and p2ad has a rising edge and a falling edge that occur between and at different times from a falling edge of pulses of gain cycle clock signals p2b and p2bd and a rising edge of next pulses of gain cycle clock signals p2b and p2bd. Maintaining this non-overlapping gain cycle clock signal arrangement causes the switched capacitor circuits 202 and 204 to produce a middle stage residual voltage at node 216 having the same output frequency as the initial stage residual voltage generated by the initial stage of the ADC 100 when the RSD 200 is used as a middle stage, which is more clearly shown by further reference to the timing relationships of the clock signals shown in FIG. 3.

Figure 3:
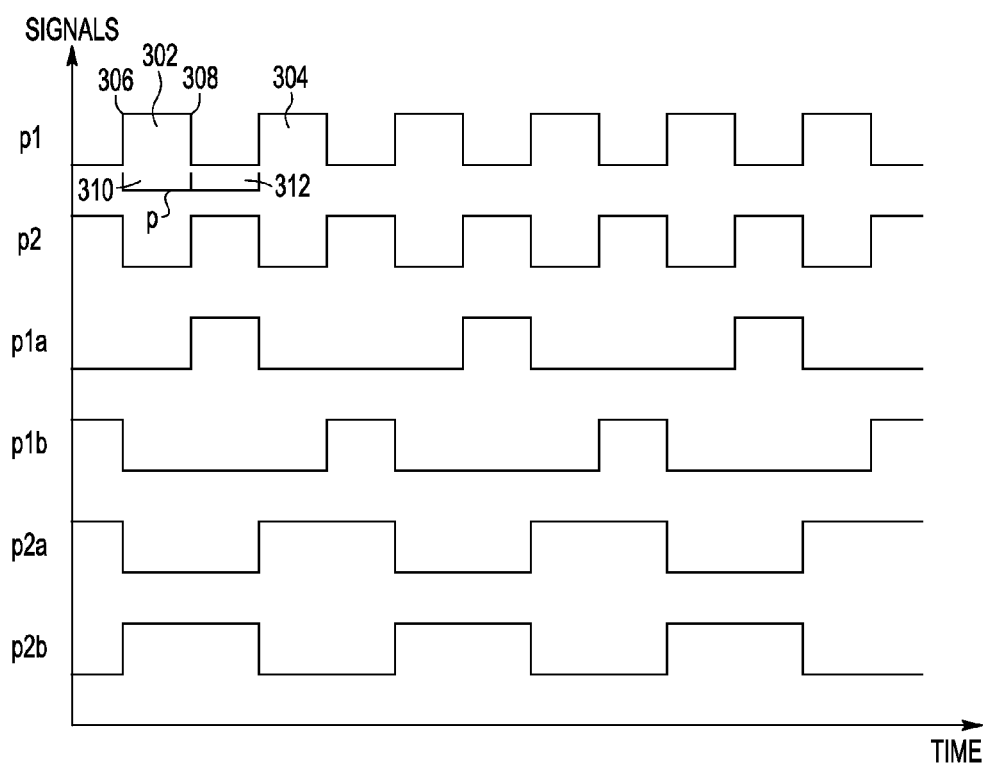
FIG. 3 is a diagram depicting the relative timing of example clock signals that influence the operation of the circuit shown in FIG. 2, in accordance with an embodiment.

FIG. 3 depicts clock signals p1, p2, p1a, p1b, p2a, p2b. All of the clock signals described herein including a main clock signal (clkin) (FIG. 4), and an inverse of the main clock signal (also referred to herein as an inverted main clock signal) and clock signals p1, p2, p1a, p1b, p2a, p2b (and the delayed and complementary versions of these clock signals) are periodic (i.e., repeating) signals characterized by a plurality of pulses (e.g., 302 and 304) and a frequency. As shown, the pulse 302 immediately precedes the pulse 304; and the pulse 304 immediately succeeds or is the next pulse after the pulse 302. Each pulse of a clock signal has a rising edge (e.g., 306) and a falling edge (e.g., 308). The frequency of the clock signal is functionally related to a constant period P of the clock signal, which is characterized by a high phase (e.g., 310) and a low phase (e.g., 312).

The main clock signal is the clock signal by which all other clock signals used in the ADC are synchronized and sets the sampling frequency of the ADC. Clock signals p1 and p2 are primary clock signals that, in an embodiment, are supplied to an initial pipeline stage, e.g., 110. The primary clock signals p1 and p2 are generated using at least the main clock signal and have the same frequency as the main clock signal and the inverted main clock signal. Clock signals p1*a* (and corresponding delayed (p1*ad*) and complementary (p1*ad*_c) clock signals), p1*b* (and corresponding delayed (p1*bd*) and complementary (p1*bd*_c) clock signals), p2*a* (and corresponding delayed (p2*ad*) and complementary (p2*ad*_c) clock signals), and p2*b* (and corresponding delayed (p2*bd*) and complementary (p2*bd*_c) clock signals) are generated in a non-overlapping circuit, in accordance with an embodiment of the present disclosure, for instance a non-overlapping circuit 700 illustrated in FIG. 7. As used herein, a "delayed" version of a clock signal A (i.e., Ad) has pulses that are generated from the clock signal A but have at least the falling edge (and in some embodiments both the falling and the rising edge) that is delayed by one or more digital logic elements that serve as delay element(s). An inverse of a clock signal A (i.e., A_c, also referred to herein as an inverted clock signal, a complementary clock signal, or the compliment of a clock signal) is high when the clock signal A is low and is low when the clock signal A is high, thereby always being at opposite or inverse values.

With more particularity regarding the use of and timing relationships between the clock signals shown in FIG. 3, the primary clock signal p1 is provided to a set of sampling cycle control switches of a switched capacitor circuit within the initial stage of the ADC. The primary clock signal p2 is provided to a set of gain cycle control switches of the switched capacitor circuit within the initial stage of the ADC and controls an output frequency of the initial stage residual voltage. More specifically, the initial stage outputs the initial stage residual voltage at every p2 pulse. Moreover, the timing of the sampling cycle clock signals p1*a* and p1*b* relates to the timing of the primary clock signal p2 such that one pulse of each of the sampling cycle clock signals p1*a* and p1*b* is generated for every two pulses of the primary clock signal p2. Each time the initial stage passes an initial stage residual voltage, one or the other of the switched capacitor circuits of an immediately succeeding middle stage samples the initial stage residual voltage. Accordingly, the middle stages operate at the same sampling rate as the initial stage even though the circuitry within the middle stage operates at a fraction (in this case one half) of the frequency (based on the frequency of the corresponding clock signals provided to the circuitry).

Additionally, the gain cycle clock signals p2*a* and p2*b* control the middle stage voltage residue output to occur at a particular frequency. As can be seen, the gain cycle clock signals p2*a* and p2*b* are timed (by having either a high p2*a* pulse or a high p2*b* pulse at each high p2 pulse) such that the output frequency of the middle stage residual voltage is the same as the output frequency of the initial stage residue voltage, which is controlled by the primary clock signal p2. Again, even though each set of switched capacitor circuitry within the middle stage operates at a fraction (in this case one half) of the frequency of the switched capacitor circuitry of the initial stage, the middle stage residual voltage is output at the same output frequency as the initial stage residual voltage.

Figure 4:
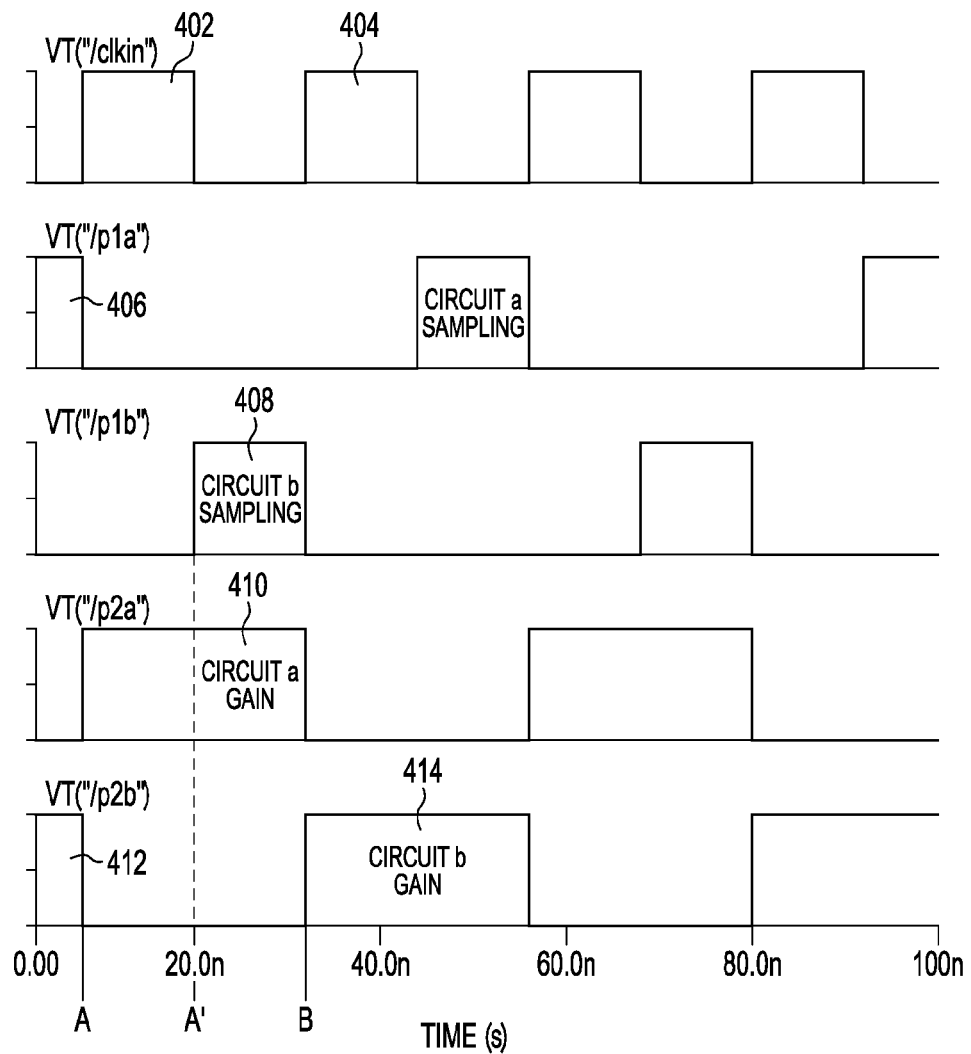
FIG. 4 is a diagram depicting example clock signals of FIG. 3, shown relative to a time axis and a main clock signal and illustrating points A, A' and B in time, in accordance with an embodiment.
Figure 5:
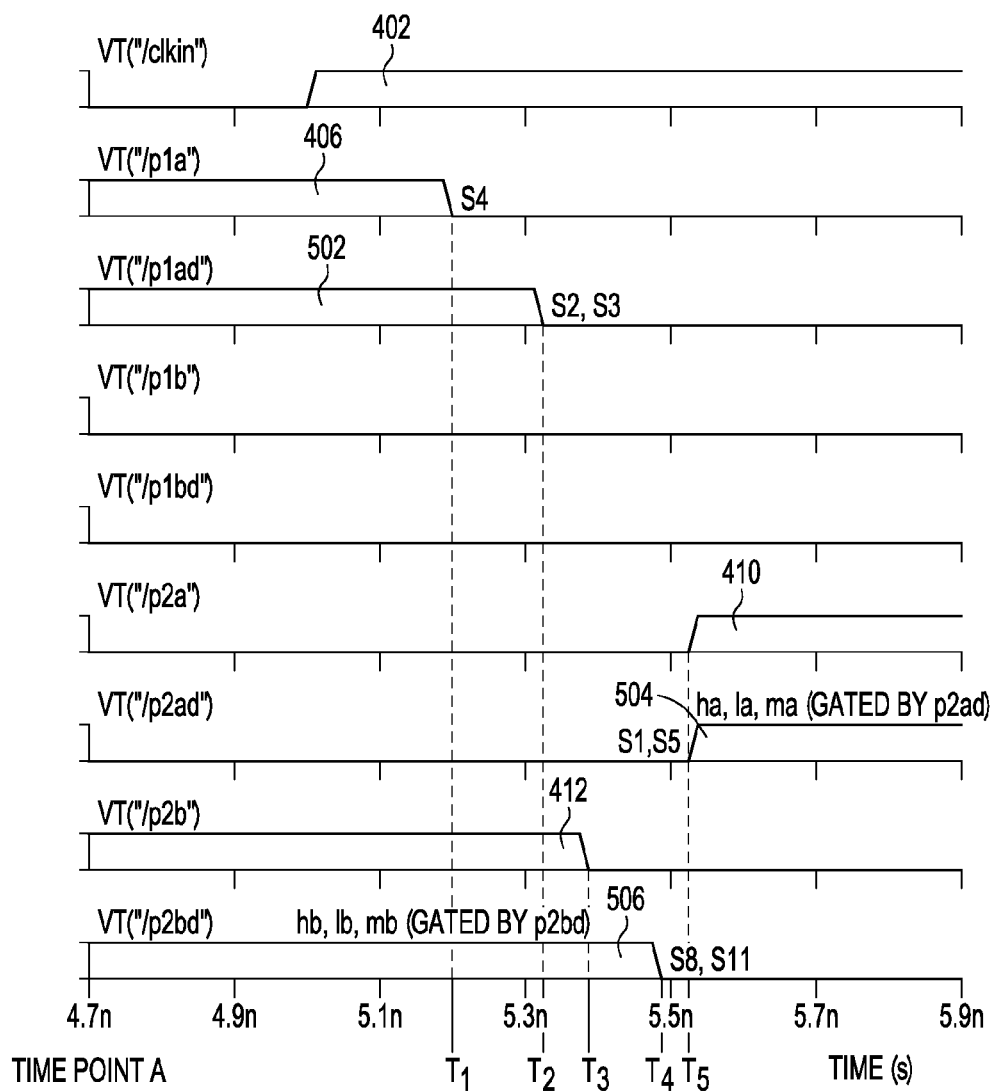
FIG. 5 is a diagram depicting the clock signals of FIG. 4 at the point A in time, in accordance with an embodiment.
Figure 6:
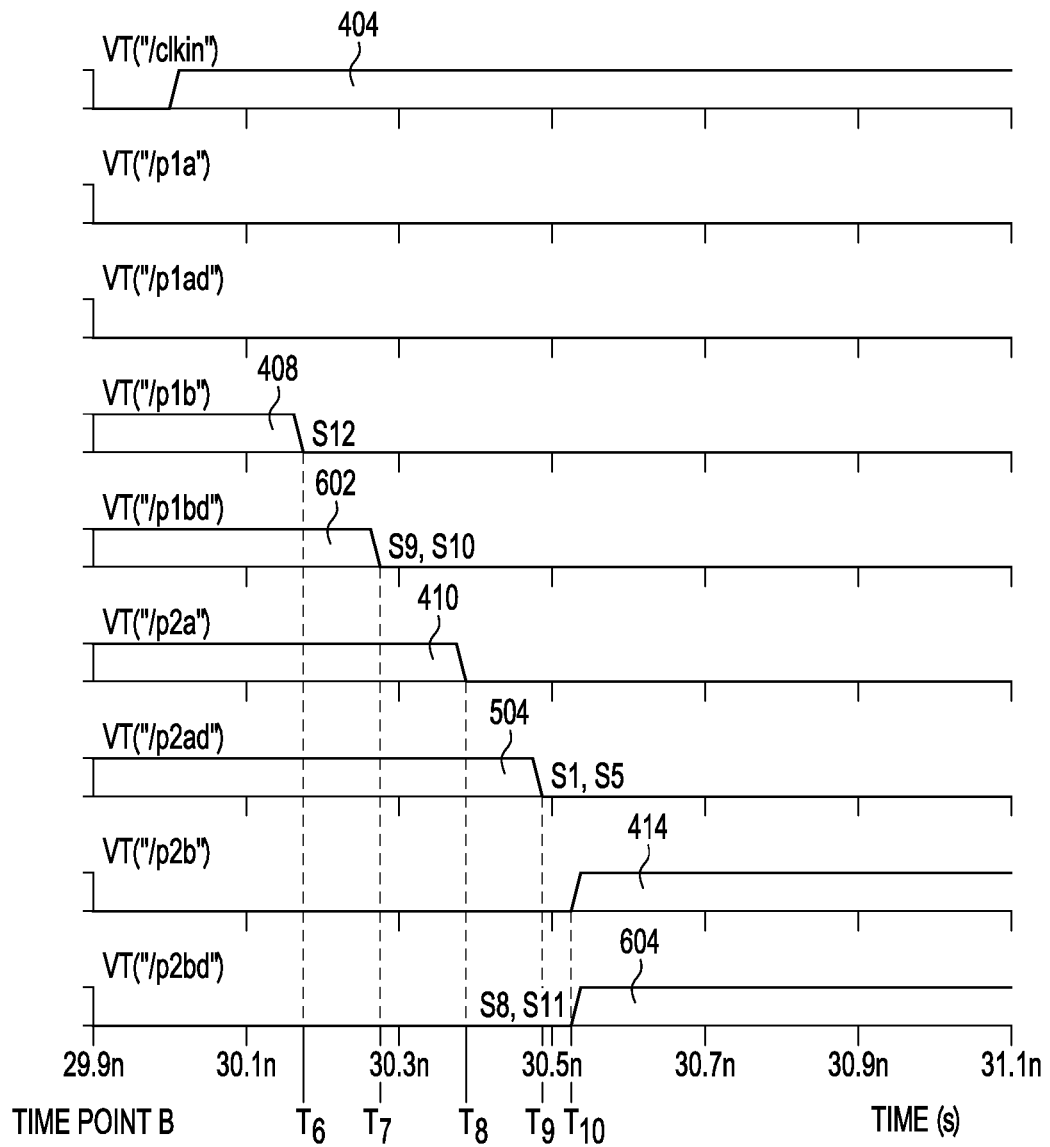
FIG. 6 is a diagram depicting the clock signals of FIG. 4 at the point B in time, in accordance with an embodiment.

FIG. 4 to FIG. 6 depicts additional details of the required timing relationships between the sampling cycle clock signals and the gain cycle clock signals provided in accordance with the present teachings in order for the proper operation of the RSD stage 200 shown in FIG. 2. More particularly, FIG. 4 depicts clock signals clkin, pla, plb, p2*a*, and p2*b* along the same time axis, and the timing relationships of these signals are shown by reference to a time point A and a time point B. FIG. 4 further shows clkin pulses 402 and 404, a pulse 406 of the pla clock signal (that can be used for the circuit a sampling function), a pulse 408 of the plb clock signal (that can be used for the circuit b sampling function), a pulse 410 of the p2*a* clock signal (that can be used for the circuit a gain function), and pulses 412 and 414 of the p2*b* clock circuit (that can be used for the circuit b gain function).

FIG. 5 depicts the timing relationships, at the time point A, between the clkin pulse 402, the pulse 406 of the pla clock signal (also referred to herein as a first sampling cycle clock signal), a pulse 502 of the plad clock signal (also referred to herein as a delayed first sampling cycle clock signal), the pulse 410 of the p2*a* clock signal (also referred to herein as a first gain cycle clock signal), a pulse 504 of the p2*ad* clock signal (also referred to herein as a delayed first gain cycle clock signal), the pulse 412 of the p2*b* clock signal (also referred to herein as a second gain cycle clock signal), and a pulse 506 of the p2*bd* clock signal (also referred to herein as a delayed second gain cycle clock signal). At time point A clock signals p1*b* and p1*bd* are not generated. FIG. 6 depicts the timing relationships, at the time point B, between the clkin pulse 404, the pulse 408 of the plb clock signal (also referred to herein as a second sampling cycle clock signal), a pulse 602 of the plbd clock signal (also referred to herein as a delayed second sampling cycle clock signal), the pulse 410 of the p2*a* clock signal, the pulse 504 of the p2*ad* clock signal, pulse 414 of the p2*b* clock signal, and a pulse 604 of the p2*bd* clock signal. At time point A clock signals p1*a* and p1*ad* are not generated.

As shown in FIG. 5, at the illustrative time point A, responsive to a rising edge of a first main clock signal pulse 402, an embodiment of a non-overlapping clock generation circuit in accordance with the present teachings is configured to generate: a falling edge of a first pulse 406 of the first sampling cycle clock signal (provided to sampling cycle control switch S4 of the switched capacitor circuit 202); followed by a falling edge of a first pulse 502 of the delayed first sampling cycle clock signal (provided to sampling cycle control switches S2 and S3 of the switched capacitor circuit 202); followed by a falling edge of a first pulse 412 of the second gain cycle clock signal; followed by a falling edge of a first pulse 506 of the delayed second gain cycle clock signal (provided to gain cycle control switches S8 and S11 of the switched capacitor circuit 204 and also used to gate switches S14, S15, and S16 of the switched capacitor circuit 204, which are controlled by control signals hb, lb, and mb, respectively); followed by a rising edge of a first pulse 410 of the first gain cycle clock signal and a rising edge of a first pulse 504 of the delayed first gain cycle clock signal (provided to gain cycle control switches S1 and S5 of the switched capacitor circuit 202 and also used to gate switches to gate S6, S7, and S13 of the switched capacitor circuit 202, which are controlled by control signals ha, la, and ma, respectively). As shown, the rising edges of pulses 410 and 504 occur at the same time (or substantially the same time within the physical limitations of the circuitry, taking into account parameters such as random mismatch) to maximize the settling time of the gain cycle of the switched capacitor circuit 202. However, in accordance with an alternative implementation, the rising edge of the pulse 504 occurs after the rising edge of the pulse 410 due to the inclusion of a delay element, e.g., an inverter or other logic gate, to receive a signal at its input and provide the delayed signal at its output, with no provision for simultaneous rising edges.

Based on the arrangement of the two switched capacitor circuits 202 and 204 within the RSD stage 200, during the entire time that the switched capacitor circuit 202 is performing the sampling cycle function (using one pulse each of p1*a* and p1*ad*), the switched capacitor circuit 204 is performing the gain cycle function (using a pulse of p2*bd*). The rising edges of p2*a* and p2*ad* (used during the gain cycle of circuit 202) occur at the same time or substantially the same time to maximize the settling time of the gain cycle and occur after the falling edges of p1*a* and p1*ad* to ensure that the switched capacitor circuit 202 completes its sampling cycle before beginning its gain cycle. Since the switched capacitor circuits 202 and 204 share an amplifier 206, the rising edges of p2*a* and p2*ad* also occur after the falling edges of p2*b* and p2*bd* to ensure that only one of the switched capacitor circuits at any giving point in time is performing the gain cycle function using the shared amplifier 206.

As shown in FIG. 6, at the illustrative time point B, responsive to a rising edge of a second main clock signal pulse 404 that immediately succeeds the first main clock signal pulse 402, the non-overlapping clock generation circuit in accordance with the present teachings is configured to generate: a falling edge of a first pulse 408 of the second sampling cycle clock signal (provided to sampling cycle control switch S12 of the switched capacitor circuit 204); followed by a falling edge of a first pulse 602 of the delayed second sampling cycle clock signal (provided to sampling cycle control switches S9 and S10 of the switched capacitor circuit 204), with the rising edge of pulses 408 and 602 occurring at a time point A' (FIG. 4); followed by a falling edge of the first pulse 410 of the first gain cycle clock signal; followed by a falling edge of the first pulse 504 of the delayed first gain cycle clock signal (provided to gain cycle control switches S1 and S5 of the switched capacitor circuit 202); followed by a rising edge of a second pulse 414 of the second gain cycle clock signal and a rising edge of a second pulse 604 of the delayed second gain cycle clock signal (provided to gain cycle control switches S8 and S11 of the switched capacitor circuit 204), wherein the first pulse 412 of the second gain cycle clock signal immediately precedes the second pulse 414 of the second gain cycle clock signal, and the first pulse 506 of the delayed second gain cycle clock signal immediately precedes the second pulse 604 of the delayed second gain cycle clock signal. As, shown, the rising edges of pulses 414 and 604 occur at the same time or substantially the same time to maximize the settling time of the gain cycle of the switched capacitor circuit 204. However, in accordance with an alternative implementation, the rising edge of the pulse 604 occurs after the rising edge of the pulse 414.

Based on the arrangement of the two switched capacitor circuits 202 and 204 within the RSD stage 200, during the entire time that the switched capacitor circuit 204 is performing the sampling cycle function (using one pulse each of p1*b* and p1*bd*), the switched capacitor circuit 202 is performing the gain cycle function (using a pulse of p2*ad*). The rising edges of p2*b* and p2*bd* (used during the gain cycle of circuit 204) occur at the same time or substantially the same time to maximize the settling time of the gain cycle and occur after the falling edges of p1*b* and p1*bd* to ensure that the switched capacitor circuit 204 completes its sampling cycle before beginning its gain cycle. Since the switched capacitor circuits 202 and 204 share an amplifier 206, the rising edges of p2*b* and p2*bd* occur after the falling edges of p2*a* and p2*ad* to ensure that only one of the switched capacitor circuits at any giving point in time is performing the gaining cycle function using the shared amplifier 206.

Figure 7:
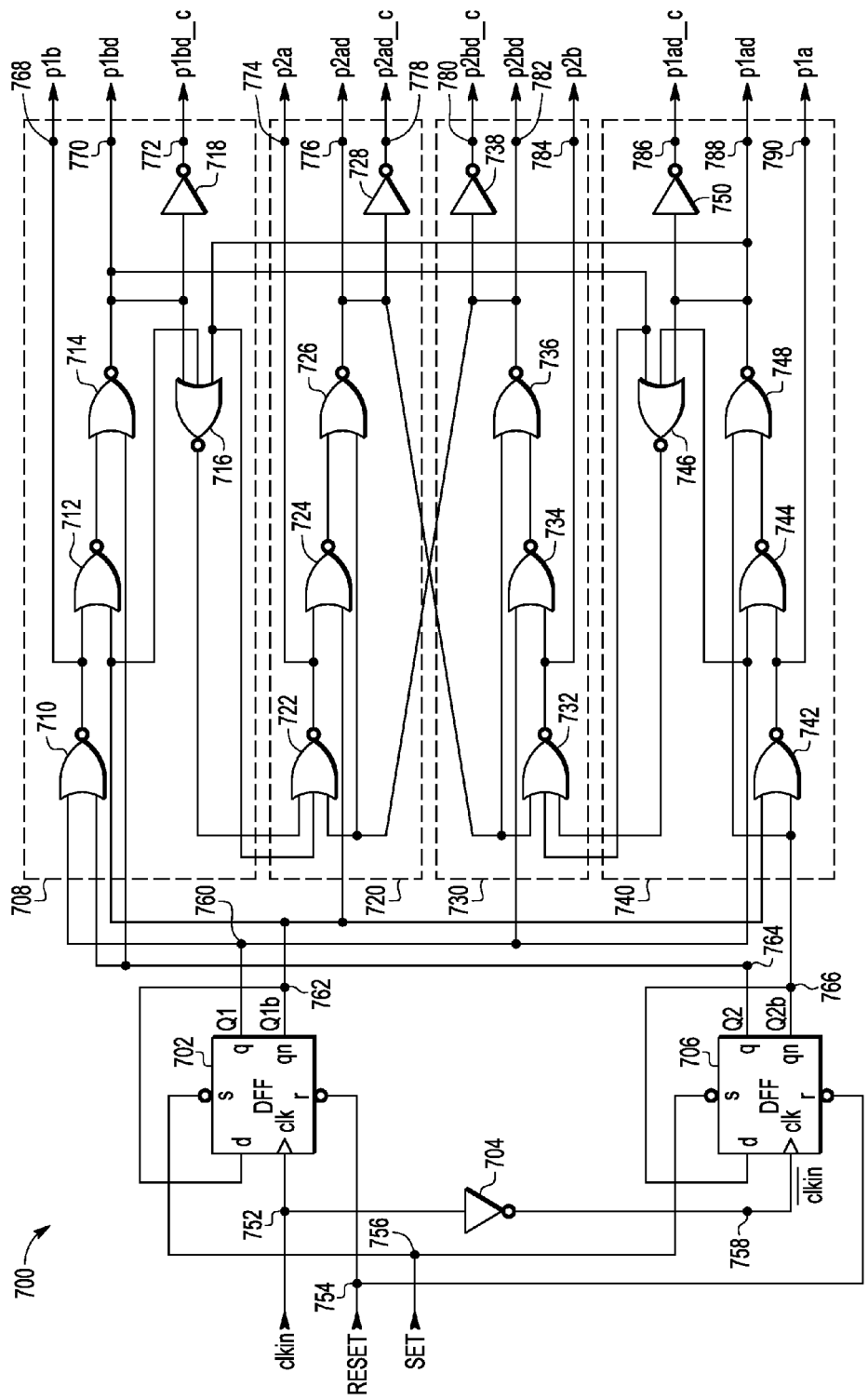
FIG. 7 is a circuit diagram illustrating a non-overlapping clock generation circuit that outputs the clock signals having the timing relationships shown in FIG. 4 to FIG. 6, in accordance with an embodiment.

Turning now to FIG. 7, shown therein is one illustrative embodiment of a non-overlapping clock generation circuit arrangement 700 for generating the clock signals and timing relationships illustrated by reference to FIG. 3 to FIG. 6, which can be used for the proper operation of an initial or middle stage of a pipelined ADC, such as the RSD stage 200 of FIG. 2. The embodiment shown in FIG. 7 comprises digital logic elements that include D-type flip flops, NOR logic gates (also referred to herein as NOR gates) and inverters, wherein the digital logic elements are implemented using any suitable transistor technology including, but not limited to, MOSFET technology. However, circuits having the functional equivalent of the non-overlapping clock generation circuit 700 could be devised using different types of digital logic elements (e.g., NAND logic gates) or transistor technology to generate the clock signals and timing relationships illustrated by reference to FIG. 3 to FIG. 6. As used herein, the terms "configured to", "configured with", "arranged to", "arranged with", "capable of" and any like or similar terms mean that referenced circuit elements have an internal physical arrangement (such as by virtue of the particular transistor technology used) and/or physical coupling and/or connectivity with other circuit elements in an inactive state. This physical arrangement and/or physical coupling and/or connectivity while in the inactive state, enables the circuit elements to perform stated functionality while in the active state of receiving and processing various signals at inputs of the circuit elements to generate signals at the output of the circuit elements.

Non-overlapping clock generator circuit 700 comprises: a first trigger generation circuit 702 configured to receive a main clock signal clkin at a node 752 and to responsively generate first and second trigger signals Q1 and Q1*b* at nodes 760 and 762, respectively; and a second trigger generation circuit 706 configured to receive an inverted main clock signal at a node 758 and to responsively generate third and fourth trigger signals Q2 and Q2*b* at nodes 764 and 766 respectively. A trigger signal is defined as a clock signal provided at an input to one or more digital logic elements of a clock generation branch. The trigger signal is used to provide timing to enable the clock generation branch to generate one or more clock signals at respective outputs for use by a RSD stage of a pipelined ADC. In the arrangement illustrated, circuit 700 includes an inverter 704 configured with an input terminal (also referred to herein as an input) coupled to the node 752 to receive the main clock signal clkin. The inverter 704 is further configured to generate the inverted main clock signal (based on the main clock signal) at an output terminal (also referred to herein as an output) coupled to the node 758. In an alternative arrangement, the inverted main clock signal is generated outside of the circuit 700 using any suitable circuitry.

In an embodiment, the first trigger generation and 702 comprises a first frequency divider circuit configured to receive the main clock signal clkin and to responsively output the first and second trigger signals Q1 and Q1*b*; and the second trigger generation circuit 706 comprises a second frequency divider circuit configured to receive the inverse of the main clock signal and to responsively output the third and fourth trigger signals. In an embodiment, the first frequency divider circuit 702 comprises a first flip-flop configured to receive the main clock signal, to divide the main clock signal in two by frequency and to generate the first and second trigger signals Q1 and Q1*b* each having half the frequency of the main clock signal. In the particular arrangement shown in FIG. 7, the first trigger generation circuit 702 comprises a first D-type flip-flop (labeled as "DFF") having a clock input (clk), a D input (d), a Q output (q), and an inverted Q output (qn), wherein the D input of the first D-type flip-flop is coupled (or tied) to the inverted Q output of the first D-type flip-flop, and wherein the clock input of the first D-type flip-flop is configured to receive the main clock signal, the Q output of the first D-type flip-flop is configured to generate the first trigger signal Q1, and the inverted Q output of the first D-type flip-flop is configured to generate the second trigger signal Q1*b*. As is known in the art, the DFF 702 further includes an s input that receives a SET signal at a node 756 and an r input that receives a RESET signal at a node 754.

Similarly, in an embodiment, the second frequency divider circuit 706 comprises a second flip-flop configured to receive the inverse of the main clock signal, to divide the inverse of the main clock signal in two by frequency and to generate the third and fourth trigger signals Q2 and Q2*b* each having half the frequency of the inverse of the main clock signal. In the particular arrangement shown in FIG. 7, the second trigger generation circuit 706 comprises a second D-type flip-flop (labeled as "DFF") having a clock input (clk), a D input (d), a Q output (q), and an inverted Q output (qn), wherein the D input of the second D-type flip-flop is coupled (or tied) to the inverted Q output of the second D-type flip-flop, and wherein the clock input of the second D-type flip-flop is configured to receive the inverted main clock signal, the Q output of the second D-type flip-flop is configured to generate the third trigger signal Q2, and the inverted Q output of the second D-type flip-flop is configured to generate the fourth trigger signal Q2*b*. As is known in the art, the DFF 706 further includes an s input that receives the SET signal at the node 756 and an r input that receives the RESET signal at the node 754.

Non-overlapping clock generator circuit 700 further includes a first clock generation branch 740, a second clock generation branch 708, a third clock generation branch 720, and a fourth clock generation branch 730. Each clock generation branch receives one or more of the trigger signals and responsively generates one or more clock signals supplied to a pipelined ADC stage such as the RSD stage 200.

In one embodiment, the first clock generation branch 740 includes a first plurality of digital logic elements, which in this instance is a first plurality of NOR gates comprising a first NOR gate 742, a second NOR gate 744, a third NOR gate 748 and a fourth NOR gate 746, that is configured (i.e., operatively coupled, for instance as described by reference to FIG. 7 as explained in detail below) to receive the first, second and fourth trigger signals and to responsively generate a first sampling cycle clock signal p1*a* at a node 790 and a delayed first sampling cycle clock signal p1*ad* at a node 788. The second clock generation branch 708 is coupled to the first clock generation branch 740 and includes a second plurality of digital logic elements, which in this instance is a second plurality of NOR gates comprising a fifth NOR gate 710, a sixth NOR gate 712, a seventh NOR gate 714 and an eighth NOR gate 716, that is configured (i.e., operatively coupled, for instance as described by reference to FIG. 7 as explained in detail below) to receive the first, second and third trigger signals and to responsively generate a second sampling cycle clock signal p1*b* at a node 768 and a delayed second sampling cycle clock signal p1*bd* at a node 770. As stated above and shown by reference to FIG. 3, for example, the first sampling cycle clock signal p1*a* and the delayed first sampling cycle clock signal p1ad are non-overlapping with the second sampling cycle clock signal p1*b* and the delayed second sampling cycle clock signal p1*bd*.

The third clock generation branch 720 is coupled to the first and second clock generation branches and includes a third plurality of digital logic elements, which in this instance is a third plurality of NOR gates comprising a ninth NOR gate 722, a tenth NOR gate 724, and an eleventh NOR gate 726, that is configured (i.e., operatively coupled, for instance as described by reference to FIG. 7 as explained in detail below) to receive the second trigger signal and to responsively generate a first gain cycle clock signal p2*a* at a node 774 and a delayed first gain cycle clock signal p2*ad* at a node 776. The fourth clock generation branch 730 is coupled to the first, second, and third clock generation branches and includes a fourth plurality of digital logic elements, which in this instance is a fourth plurality of NOR gates comprising a twelfth NOR gate 732, a thirteenth NOR gate 734, and a fourteenth NOR gate 736, that is configured (i.e., operatively coupled, for instance as described by reference to FIG. 7 as explained in detail below) to receive the first trigger signal and to responsively generate a second gain cycle clock signal p2*b* at a node 784 and a delayed second gain cycle clock signal p2*bd* at a node 782. As stated above and shown by reference to FIG. 3, for example, the first gain cycle clock signal p2*a* and the delayed first gain cycle clock signal p2*ad* are non-overlapping with the second gain cycle clock signal p2*b* and the delayed second gain cycle clock signal p2*bd*.

The physical coupling of the above non-overlapping clock generation circuit 700 arrangement is described in functional terms, as follows. Within the first clock generation branch 740, the first NOR gate 742 is configured to receive the second and fourth trigger signals (Q1*b* and Q2*b*) and to output the first sampling cycle clock signal p1*a*. The second NOR gate 744 is configured to receive the first sampling cycle clock signal p1*a* and the first trigger signal Q1 and configured with an output terminal. The third NOR gate 748 is coupled to the output terminal of the second NOR gate 744 and configured to receive the fourth trigger signal Q2*b* and to output the delayed first sampling cycle clock signal p1*ad*. The fourth NOR gate 746 is configured to receive the delayed first sampling cycle clock signal p1*ad*, the first trigger signal Q1 and the delayed second sampling cycle clock signal p1*bd* and configured with an output terminal.

Within the second clock generation branch 708, the fifth NOR gate 710 is configured to receive the first and third trigger signals (Q1 and Q2) and to output the second sampling cycle clock signal p1*b*. The sixth NOR gate 712 is configured to receive the second sampling cycle clock signal p1*b* and the second trigger signal Q1*b* and configured with an output terminal. The seventh NOR gate 714 is coupled to the output terminal of the sixth NOR gate 712 and configured to receive the third trigger signal Q2 and to output the delayed second sampling cycle clock signal p1*bd*. The eighth NOR gate 716 is configured to receive the delayed first sampling cycle clock signal p1*ad*, the delayed second sampling cycle clock signal p1*bd*, and the second trigger signal Q1*b* and configured with an output terminal.

Within the third clock generation branch 720, the ninth NOR gate 722 is coupled to the output of the eighth NOR gate 716 and configured to receive the delayed first sampling cycle clock signal p1*ad* and the delayed second gain cycle clock signal p2*bd* and to output the first gain cycle clock signal p2*a*. The tenth NOR gate 724 is configured to receive the first gain cycle clock signal p2*a* and the second trigger signal Q1*b* and configured with an output terminal. The eleventh NOR gate 726 is coupled to the output terminal of the tenth NOR gate 724 and configured to receive the delayed second gain cycle clock signal p2*bd* and to output the delayed first gain cycle clock signal p2*ad*.

Within the fourth clock generation branch 730, the twelfth NOR gate 732 is coupled to the output of the fourth NOR gate 746 and configured to receive the delayed second sampling cycle clock p1*bd* signal and the delayed first gain cycle clock signal p2*ad* and to output the second gain cycle clock signal p2*b*. The thirteenth NOR gate 734 is configured to receive the first trigger signal Q1 and the second gain cycle clock signal p2*b* and configured with an output terminal. The fourteenth NOR gate 736 is coupled to the output terminal of the thirteenth NOR gate 734 and configured to receive the delayed first gain cycle clock signal p2ad and to output the delayed second gain cycle clock signal p2bd.

Using the following physical coupling, the non-overlapping clock generation circuit 700 provides clock signals to an initial or middle RSD stage (e.g., RSD stage 200) of a pipelined analog-to-digital converter (e.g., ADC 100) as follows. The first clock generation branch 740 comprises first and second outputs configured (via a coupling to nodes 790 and 788, respectively) to provide the first sampling cycle clock signal p1a and the delayed first sampling cycle clock signal p1ad to a first set of sampling cycle control switches within a RSD stage of a pipelined analog-to-digital converter. The second clock generation branch 708 comprises third and fourth outputs configured (via a coupling to nodes 768 and 770, respectively) to provide the second sampling cycle clock signal p1b and the delayed second sampling cycle clock signal p1bd to a second set of sampling cycle control switches within the RSD stage of the pipelined analog-to-digital converter. The third clock generation branch 720 comprises a fifth output configured (via a coupling to node 776) to provide the delayed first gain cycle clock signal p2ad to a first set of gain cycle control switches within the RSD stage of the pipelined analog-to-digital converter. The fourth clock generation branch 730 comprises a sixth output configured (via a coupling to node 782) to provide the delayed second gain cycle clock signal p2bd to a second set of gain cycle control switches within the RSD stage of the pipelined analog-to-digital converter.

The first clock generation branch 740 further comprises a first inverter 750 coupled to the third NOR logic gate 748 (of the first plurality of NOR gates) at the node 788 to receive the delayed first sampling cycle clock signal p1ad and to generate and output at a node 786 a complementary delayed first sampling cycle clock signal p1ad_c (also referred to herein as a complement signal of the delayed first sampling cycle clock signal). The second clock generation branch 708 further comprises a second inverter 718 coupled to the seventh NOR logic gate 714 (of the second plurality of NOR gates) at the node 770 to receive the delayed second sampling cycle clock signal p1bd and to generate and output at a node 772 a complementary delayed second sampling cycle clock signal p1bd_c (also referred to herein as a complement signal of the delayed second sampling cycle clock signal). The third clock generation branch 720 further comprises a third inverter 728 coupled to the eleventh NOR logic gate 726 (of the third plurality of NOR gates) at the node 776 to receive the delayed first gain cycle clock signal p2ad and to generate and output at a node 778 a complementary delayed first gain cycle clock signal p2ad_c (also referred to herein as a complement signal of the delayed first gain cycle clock signal). The fourth clock generation branch 730 further comprises a fourth inverter 738 coupled to the fourteenth NOR logic gate 736 (of the fourth plurality of NOR gates) at the node 782 to receive the delayed second gain cycle clock signal p2bd and to generate and output at a node 780 a complementary delayed second gain cycle clock signal p2bd_c (also referred to herein as a complement signal of the delayed second gain cycle clock signal). In an embodiment, some of the switches in the pipelined RSD stage use the complementary signals p1ad_c (e.g., switches S2 and S3), p1bd_c (e.g., switches S9 and S10), p2ad_c (e.g., switches S1 and S5), and p2bd_c (e.g., switches S8 and S11).

Stated another way, the particular physical coupling and/or connectivity of the NOR logic gates and inverters of the circuit 700 is as follows. The first, second and third NOR logic gates (742, 744, 748) each comprise first and second inputs and an output, and the fourth NOR logic gate 746 comprises first, second and third inputs and an output. The fifth, sixth and seventh NOR logic gates (710-714) each comprise first and second inputs and an output, and the eighth NOR logic gate 716 comprises first, second and third inputs and an output. The ninth NOR logic gate 722 includes first, second and third inputs and an output, and the tenth and eleventh NOR logic gates (724, 726) each include first and second inputs and an output. The twelfth NOR logic gate 732 includes first, second and third inputs and an output, and the thirteenth and fourteenth NOR logic gates (734, 736) each include first and second inputs and an output.

Within the first clock generation branch 740: the first input of the first NOR logic gate 742 is coupled to the second output of the first trigger generation circuit 702; the second input of the first NOR logic gate 742 is coupled to the second output of the second trigger generation circuit 706; the output of the first NOR logic gate 742 is coupled to the second input of the second NOR logic gate 744; the first input of the second NOR logic gate 744 is coupled to the first output of the first trigger generation circuit 702; the output of the second NOR logic gate 744 is coupled to the second input of the third NOR logic gate 748; the first input of the third NOR logic gate 748 is coupled to the second output of the second trigger generation circuit 706; the output of the third NOR logic gate 748 is coupled to the third input of the fourth NOR logic gate 746; the second input of the fourth NOR logic 746 gate is coupled to the first output of the first trigger generation circuit 702; the first input of the fourth NOR logic gate 746 is coupled to the output of the seventh NOR logic gate 714; the output of the fourth NOR logic gate 746 is coupled to the third input of the twelfth NOR logic gate 732.

Within the second clock generation branch 708: the first input of the fifth NOR logic gate 710 is coupled to the first output of the first trigger generation circuit 702; the second input of the fifth NOR logic gate 710 is coupled to the first output of the second trigger generation circuit 706; the output of the fifth NOR logic gate 710 is coupled to the first input of the sixth NOR logic gate 712; the second input of the sixth NOR logic gate 712 is coupled to the second output of the first trigger generation circuit 702; the output of the sixth NOR logic gate 712 is coupled to the first input of the seventh NOR logic gate 714; the second input of the seventh NOR logic gate 714 is coupled to the first output of the second trigger generation circuit 706; the output of the seventh NOR logic gate 714 is coupled to the first input of the eighth NOR logic gate 716; the second input of the eighth NOR logic gate 716 is coupled to the second output of the first trigger generation circuit 702; the third input of the eighth NOR logic gate 716 is coupled to the output of the third NOR logic gate 748; the output of the eighth NOR logic gate 716 is coupled to the first input of the ninth NOR logic gate 722.

Within the third clock generation branch 720: the second input of the ninth NOR logic gate 722 is coupled to the output of third NOR logic gate 748; the third input of the ninth NOR logic gate 722 is coupled to the output of the fourteenth NOR logic gate 736; the output of the ninth NOR logic gate 722 is coupled to the first input of the tenth NOR logic gate 724; the second input of the tenth NOR logic gate 724 is coupled to the second output of the first trigger generation circuit 702; the output of the tenth NOR logic gate 724 is coupled to the first input of the eleventh NOR logic gate 726; the second input of the eleventh NOR logic gate 726 is coupled to the output of the fourteenth NOR logic gate 736; the output of the eleventh NOR logic gate 726 is coupled to the first input of the twelfth NOR logic gate 732.

Within the fourth clock generation branch 730: the second input of the twelfth NOR logic gate 732 is coupled to the output of the seventh NOR logic gate 714; the output of the twelfth NOR logic gate 732 is coupled to the second input of the thirteenth NOR logic gate 734; the first input of the thirteenth NOR logic gate 734 is coupled to the first output of the first trigger generation circuit 702; the output of the thirteenth NOR logic gate 734 is coupled to the second input of the fourteenth NOR logic gate 736; and the first input of the fourteenth NOR logic gate 736 is coupled to the output of the eleventh NOR logic gate 726.

Using the above physical coupling and connectivity between the NOR gates of non-overlapping clock generation circuit 700, the first plurality (740) of digital logic elements is configured to generate the first sampling cycle clock signal p1a at the output of the first NOR logic gate 742 and is configured to generate the delayed first sampling cycle clock signal p1ad at the output of the third NOR logic gate 748. The second plurality (708) of digital logic elements is configured to generate the second sampling cycle clock signal p1b at the output of the fifth NOR logic gate 710 and is configured to generate the delayed second sampling cycle clock signal p1bd at the output of the seventh NOR logic gate 714. The third plurality (720) of digital logic elements is configured to generate the first gain cycle clock signal p2a at the output of the ninth NOR logic gate 722 and is configured to generate the delayed first gain cycle clock signal p2ad at the output of the eleventh NOR logic gate 726. The fourth plurality (730) of digital logic elements is configured to generate the second gain cycle clock signal p2b at the output of the twelfth NOR logic gate 732 and is configured to generate the delayed second gain cycle clock signal p2bd at the output of the fourteenth NOR logic gate 736.

Moreover, the first plurality (740) of digital logic elements further comprises the first inverter 750 having an input coupled to the output of the third NOR logic gate 748 and having an output at the node 786 at which the complementary delayed first sampling cycle clock signal p1ad_c is generated. The second plurality (708) of digital logic elements further comprises the second inverter 718 having an input coupled to the output of the seventh NOR logic gate 714 and having an output at the node 772 at which the complementary delayed second sampling cycle clock signal p1bd_c is generated. The third plurality (720) of digital logic elements further comprises the third inverter 728 having an input coupled to the output of the eleventh NOR logic gate 726 and having an output at the node 778 at which the complementary delayed first gain cycle clock signal p2ad_c is generated. The fourth plurality (730) of digital logic elements further comprises the fourth inverter 738 having an input coupled to the output of the fourteenth NOR logic gate 736 and having an output at the node 780 at which the complementary delayed second gain cycle clock signal p2bd_c is generated.

Figure 8:
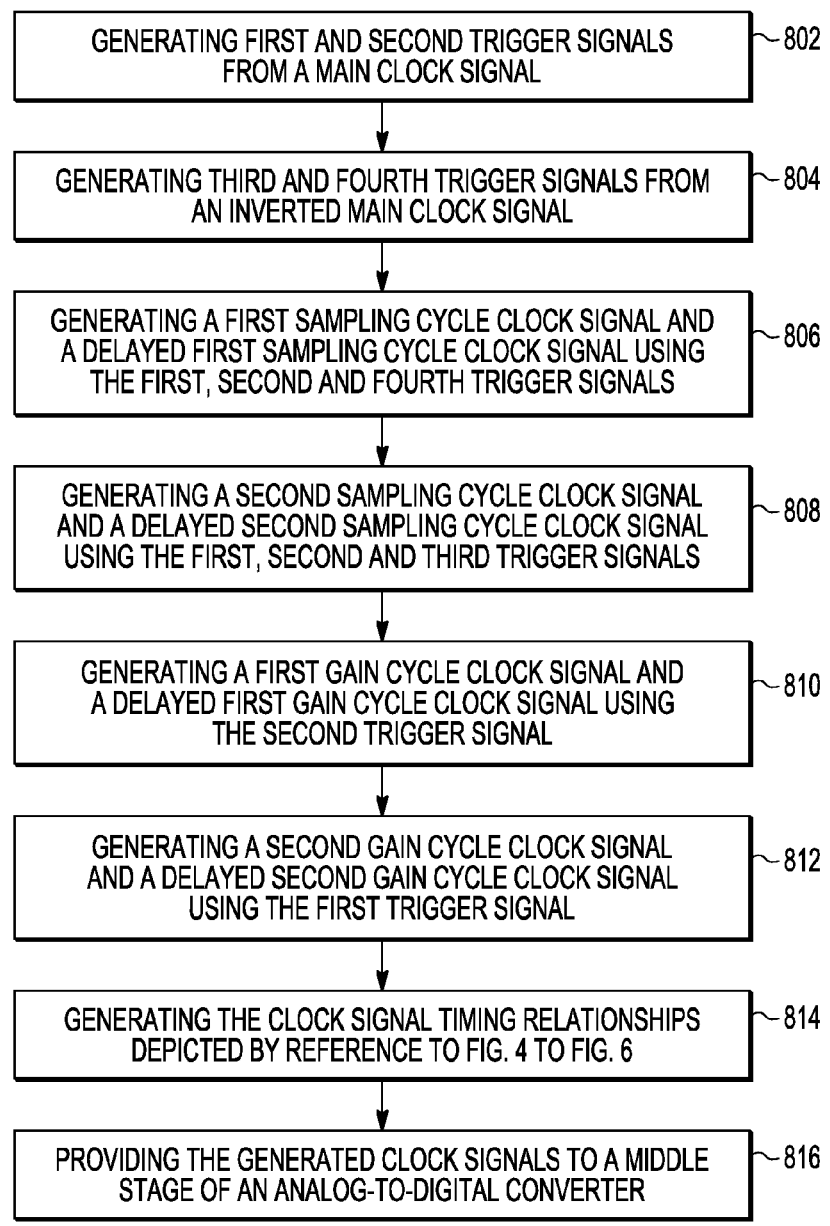
FIG. 8 is a flow diagram illustrating a method for generating the clock signals having the timing relationships shown in FIG. 4 to FIG. 6, in accordance with an embodiment.

FIG. 8 is a flow diagram illustrating a method 800 for generating the clock signals having the timing relationships shown in FIG. 4 to FIG. 6, in accordance with an embodiment. Method 800 is performed by a non-overlapping clock generation circuit in accordance with the present teachings, such as the circuit 700 described above by reference to FIG. 7. However, any suitable alternative non-overlapping clock generation circuit arrangement could be used to perform method 800.

Method 800 provides for generating 806 a first sampling cycle clock signal and a delayed first sampling cycle clock signal; generating 808 a second sampling cycle clock signal and a delayed second sampling cycle clock signal; generating 810 a first gain cycle clock signal and a delayed first gain cycle clock signal; generating 812 a second gain cycle clock signal and a delayed second gain cycle clock signal. As described in detail above, the first sampling cycle clock signal, the delayed first sampling cycle clock signal, the second sampling cycle clock signal, the delayed second sampling cycle clock signal, the first gain cycle clock signal, the delayed first gain cycle clock signal, the second gain cycle clock signal, and the delayed second gain cycle clock signal are each periodic signals having a frequency and comprising a plurality of pulses. Each pulse of the first sampling cycle clock signal and the delayed first sampling cycle clock signal has a rising edge and a falling edge that occur between and at different times from a falling edge of pulses of the second sampling cycle clock signal and the delayed second sampling cycle clock signal and a rising edge of next pulses of the second sampling cycle clock signal and the delayed second sampling cycle clock signal. Each pulse of the first gain cycle clock signal and the delayed first gain cycle clock signal has a rising edge and a falling edge that occur between and at different times from a falling edge of pulses of the second gain cycle clock signal and the delayed second gain cycle clock signal and a rising edge of next pulses of the second gain cycle clock signal and the delayed second gain cycle clock signal.

The method 800 further comprises generating 814 the clock signal timing relationships depicted by reference to FIG. 4 to FIG. 6. More particularly, on a rising edge of a pulse of a main clock signal, the non-overlapping clock generation circuit generates a falling edge of a pulse of the first sampling cycle clock signal, followed by a falling edge of a pulse of the delayed first sampling cycle clock signal, followed by a falling edge of a pulse of the second gain cycle clock signal, followed by a falling edge of a pulse of the delayed second gain cycle clock signal, followed by a rising edge of a pulse of the first gain cycle clock signal and a rising edge of a pulse of the delayed first gain cycle clock signal. Additionally, on a rising edge of a next pulse of the main clock signal, generating a falling edge of a pulse of the second sampling cycle clock signal, followed by a falling edge of a pulse of the delayed second sampling cycle clock signal, followed by a falling edge of the pulse of the first gain cycle clock signal, followed by a falling edge of the pulse of the delayed first gain cycle clock signal, followed by a rising edge of a next pulse of the second gain cycle clock signal and a rising edge of a next pulse of the delayed second gain cycle clock signal.

In accordance with an embodiment, the frequency of the first sampling cycle clock signal, the delayed first sampling cycle clock signal, the second sampling cycle clock signal, the delayed second sampling cycle clock signal, the first gain cycle clock signal, the delayed first gain cycle clock signal, the second gain cycle clock signal, and the delayed second gain cycle clock signal are a fraction of the frequency of the main clock signal and the inverted main clock signal. For example, the fraction is half.

The method 800 further includes providing 816 the generated clock signals to a middle (or initial) stage of an analog-to-digital converter. More particularly, at 816, the method 800 comprises: providing the first sampling cycle clock signal and the delayed first sampling cycle clock signal to a set of sampling cycle control switches of a first switched capacitor circuit within a middle stage of an analog-to-digital converter; providing the second sampling cycle clock signal and the delayed second sampling cycle clock signal to a set of sampling cycle control switches of a second switched capacitor circuit within the middle stage of the analog-to-digital converter; providing the delayed first gain cycle clock signal to a set of gain cycle control switches of the first switched capacitor circuit and providing the delayed second gain cycle clock signal to a set of gain cycle control switches of the second switched capacitor circuit to control an output of a middle stage residual voltage, from the middle stage.

In a particular embodiment (for example where the non-overlapping clock generation circuit is as described by reference to FIG. 7), method 800 further comprises generating 802 first and second trigger signals from the main clock signal and generating 804 third and fourth trigger signals from an inverted main clock signal. With further regards to this embodiment of the method 800, the first sampling cycle clock signal and the delayed first sampling cycle clock signal are generated using the first, second and fourth trigger signals; the second sampling cycle clock signal and the delayed second sampling cycle clock signal are generated using the first, second and third trigger signals; the first gain cycle clock signal and the delayed first gain cycle clock signal are generated using the second trigger signal; and the second gain cycle clock signal and the delayed second gain cycle clock signal are generated using the first trigger signal.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. A device or structure that is "configured" in a certain way is configured in at least that way, but may also be configured in ways that are not listed.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The above description refers to nodes or features being "connected" or "coupled" together. As used here and, unless expressly stated otherwise, "coupled" means that one node or feature is directly or indirectly joined to (or is in direct or indirect communication with) another node or feature, and not necessarily physically. As used herein, unless expressly stated otherwise, "connected" means that one node or feature is directly joined to (or is in direct communication with) another node or feature. For example, a switch may be "coupled" to a plurality of nodes, but all of those nodes need not always be "connected" to each other; moreover, the switch may connect different nodes to each other depending on the state of the switch. Furthermore, although the various circuit schematics shown herein depict certain example arrangement of elements, additional intervening elements, devices, features, or components may be present in an actual embodiment (assuming that the functionality of the given circuit is not adversely affected).

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A non-overlapping clock generator circuit comprising:
   a first trigger generation circuit configured to receive a main clock signal and to responsively generate first and second trigger signals;
   a second trigger generation circuit configured to receive an inverted main clock signal and to responsively generate third and fourth trigger signals;
   a first clock generation branch comprising a first plurality of digital logic elements that is configured to receive the first, second and fourth trigger signals and to responsively generate a first sampling cycle clock signal and a delayed first sampling cycle clock signal;
   a second clock generation branch coupled to the first clock generation branch, the second clock generation branch comprising a second plurality of digital logic elements that is configured to receive the first, second and third trigger signals and to responsively generate a second sampling cycle clock signal and a delayed second sampling cycle clock signal, wherein the first sampling cycle clock signal and the delayed first sampling cycle clock signal are non-overlapping with the second sampling cycle clock signal and the delayed second sampling cycle clock signal;
   a third clock generation branch coupled to the first and second clock generation branches, the third clock generation branch comprising a third plurality of digital logic elements that is configured to receive the second trigger signal and to responsively generate a first gain cycle clock signal and a delayed first gain cycle clock signal; and a fourth clock generation branch coupled to the first, second, and third clock generation branches and comprising a fourth plurality of digital logic elements that is configured to receive the first trigger signal and to responsively generate a second gain cycle clock signal and a delayed second gain cycle clock signal, wherein the first gain cycle clock signal and the delayed first gain cycle clock signal are non-overlapping with the second gain cycle clock signal and the delayed second gain cycle clock signal.

2. The non-overlapping clock generation circuit of claim 1, wherein:

the first trigger generation circuit comprises a first D-type flip-flop having a clock input, a D input, a Q output, and an inverted Q output, wherein the D input of the first D-type flip-flop is coupled to the inverted Q output of the first D-type flip-flop, and wherein the clock input of the first D-type flip-flop is configured to receive the main clock signal, the Q output of the first D-type flip-flop is configured to generate the first trigger signal, and the inverted Q output of the first D-type flip-flop is configured to generate the second trigger signal; and the second trigger generation circuit comprises a second D-type flip-flop having a clock input, a D input, a Q output, and an inverted Q output, wherein the D input of the second D-type flip-flop is coupled to the inverted Q output of the second D-type flip-flop, and wherein the clock input of the second D-type flip-flop is configured to receive the inverted main clock signal, the Q output of the second D-type flip-flop is configured to generate the third trigger signal, and the inverted Q output of the second D-type flip-flop is configured to generate the fourth trigger signal.

3. The non-overlapping clock generation circuit of claim 1, wherein:

the first trigger generation circuit comprises a first output and a second output;

the second trigger generation circuit comprises a first output and a second output;

the first plurality of digital logic elements comprises first, second, third and fourth NOR logic gates, wherein the first, second and third NOR logic gates each comprise first and second inputs and an output, and the fourth NOR logic gate comprises first, second and third inputs and an output;

the second plurality of digital logic elements comprises fifth, sixth, seventh, and eighth NOR logic gates, wherein the fifth, sixth and seventh NOR logic gates each comprise first and second inputs and an output, and the eighth NOR logic gate comprises first, second and third inputs and an output;

the third plurality of digital logic elements comprises ninth, tenth, and eleventh NOR logic gates, with the ninth NOR logic gate comprising first, second and third inputs and an output, and the tenth and eleventh NOR logic gates each comprising first and second inputs and an output;

the fourth plurality of digital logic elements comprises twelfth, thirteenth, and fourteenth NOR logic gates, with the twelfth NOR logic gate comprising first, second and third inputs and an output, and the thirteenth and fourteenth NOR logic gates each comprising first and second inputs and an output;

wherein, the first input of the first NOR logic gate is coupled to the second output of the first trigger generation circuit, the second input of the first NOR logic gate is coupled to the second output of the second trigger generation circuit, the output of the first NOR logic gate is coupled to the second input of the second NOR logic gate, the first input of the second NOR logic gate is coupled to the first output of the first trigger generation circuit, the output of the second NOR logic gate is coupled to the second input of the third NOR logic gate, the first input of the third NOR logic gate is coupled to the second output of the second trigger generation circuit, the output of the third NOR logic gate is coupled to the third input of the fourth NOR logic gate, the second input of the fourth NOR logic gate is coupled to the first output of the first trigger generation circuit, the first input of the fourth NOR logic gate is coupled to the output of the seventh NOR logic gate, the output of the fourth NOR logic gate is coupled to the third input of the twelfth NOR logic gate;

wherein, the first input of the fifth NOR logic gate is coupled to the first output of the first trigger generation circuit, the second input of the fifth NOR logic gate is coupled to the first output of the second trigger generation circuit, the output of the fifth NOR logic gate is coupled to the first input of the sixth NOR logic gate, the second input of the sixth NOR logic gate is coupled to the second output of the first trigger generation circuit, the output of the sixth NOR logic gate is coupled to the first input of the seventh NOR logic gate, the second input of the seventh NOR logic gate is coupled to the first output of the second trigger generation circuit, the output of the seventh NOR logic gate is coupled to the first input of the eighth NOR logic gate, the second input of the eighth NOR logic gate is coupled to the second output of the first trigger generation circuit, the third input of the eighth NOR logic gate is coupled to the output of the third NOR logic gate, the output of the eighth NOR logic gate is coupled to the first input of the ninth NOR logic gate;

wherein, the second input of the ninth NOR logic gate is coupled to the output of third NOR logic gate, the third input of the ninth NOR logic gate is coupled to the output of the fourteenth NOR logic gate, the output of the ninth NOR logic gate is coupled to the first input of the tenth NOR logic gate, the second input of the tenth NOR logic gate is coupled to the second output of the first trigger generation circuit, the output of the tenth NOR logic gate is coupled to the first input of the eleventh NOR logic gate, the second input of the eleventh NOR logic gate is coupled to the output of the fourteenth NOR logic gate, the output of the eleventh NOR logic gate is coupled to the first input of the twelfth NOR logic gate; and wherein, the second input of the twelfth NOR logic gate is coupled to the output of the seventh NOR logic gate, the output of the twelfth NOR logic gate is coupled to the second input of the thirteenth NOR logic gate, the first input of the thirteenth NOR logic gate is coupled to the first output of the first trigger generation circuit, the output of the thirteenth NOR logic gate is coupled to the second input of the fourteenth NOR logic gate, and the first input of the fourteenth NOR logic gate is coupled to the output of the eleventh NOR logic gate.

4. The non-overlapping clock generation circuit of claim 3, wherein:

the first plurality of digital logic elements is configured to generate the first sampling cycle clock signal at the output of the first NOR logic gate and is configured to generate the delayed first sampling cycle clock signal at the output of the third NOR logic gate;

the second plurality of digital logic elements is configured to generate the second sampling cycle clock signal at the output of the fifth NOR logic gate and is configured to generate the delayed second sampling cycle clock signal at the output of the seventh NOR logic gate;

the third plurality of digital logic elements is configured to generate the first gain cycle clock signal at the output of the ninth NOR logic gate and is configured to generate the delayed first gain cycle clock signal at the output of the eleventh NOR logic gate;

the fourth plurality of digital logic elements is configured to generate the second gain cycle clock signal at the output of the twelfth NOR logic gate and is configured to generate the delayed second gain cycle clock signal at the output of the fourteenth NOR logic gate.

5. The non-overlapping clock generation circuit of claim 4, wherein:

the first plurality of digital logic elements further comprises a first inverter having an input coupled to the output of the third NOR logic gate and having an output;

the second plurality of digital logic elements further comprises a second inverter having an input coupled to the output of the seventh NOR logic gate and having an output;

the third plurality of digital logic elements further comprises a third inverter having an input coupled to the output of the eleventh NOR logic gate and having an output; and the fourth plurality of digital logic elements further comprises a fourth inverter having an input coupled to the output of the fourteenth NOR logic gate and having an output.

6. The non-overlapping clock generation circuit of claim 5, wherein:

the first plurality of digital logic elements is configured to generate a complementary delayed first sampling cycle clock signal at the output of the first inverter;

the second plurality of digital logic elements is configured to generate a complementary delayed second sampling cycle clock signal at the output of the second inverter;

the third plurality of digital logic elements is configured to generate a complementary delayed first gain cycle clock signal at the output of the third inverter;

the fourth plurality of digital logic elements is configured to generate a complementary delayed second gain cycle clock signal at the output of the fourth inverter.

7. The non-overlapping clock generation circuit of claim 1, wherein:

the first plurality of digital logic elements comprises a first plurality of NOR gates operatively coupled to receive the first, second and fourth trigger signals and to responsively generate the first sampling cycle clock signal and the delayed first sampling cycle clock signal;

the second plurality of digital logic elements comprises a second plurality of NOR gates operatively coupled to receive the first, second and third trigger signals and to responsively generate the second sampling cycle clock signal and the delayed second sampling cycle clock signal;

the third plurality of digital logic elements comprises a third plurality of NOR gates operatively coupled to receive the second trigger signal and to responsively generate the first gain cycle clock signal and the delayed first gain cycle clock signal;

the fourth plurality of digital logic elements comprises a fourth plurality of NOR gates operatively coupled to receive the first trigger signal and to responsively generate the second gain cycle clock signal and the delayed second gain cycle clock signal.

8. The non-overlapping clock generation circuit of claim 7, wherein:

the first plurality of NOR gates comprises a first NOR gate configured to receive the second and fourth trigger signals and to output the first sampling cycle clock signal, a second NOR gate configured to receive the first sampling cycle clock signal and the first trigger signal and configured with an output terminal, a third NOR gate coupled to the output terminal of the second NOR gate and configured to receive the fourth trigger signal and to output the delayed first sampling cycle clock signal, and a fourth NOR gate configured to receive the delayed first sampling cycle clock signal, the first trigger signal and the delayed second sampling cycle clock signal and configured with an output terminal;

the second plurality of NOR gates comprises a fifth NOR gate configured to receive the first and third trigger signals and to output the second sampling cycle clock signal, a sixth NOR gate configured to receive the second sampling cycle clock signal and the second trigger signal and configured with an output terminal, a seventh NOR gate coupled to the output terminal of the sixth NOR gate and configured to receive the third trigger signal and to output the delayed second sampling cycle clock signal, and an eighth NOR gate configured to receive the delayed first sampling cycle clock signal, the delayed second sampling cycle clock signal, and the second trigger signal and configured with an output terminal;

the third plurality of NOR gates comprises a ninth NOR gate coupled to the output of the eighth NOR gate and configured to receive the delayed first sampling cycle clock signal and the delayed second gain cycle clock signal and to output the first gain cycle clock signal, a tenth NOR gate configured to receive the first gain cycle clock signal and the second trigger signal and configured with an output terminal, an eleventh NOR gate coupled to the output terminal of the tenth NOR gate and configured to receive the delayed second gain cycle clock signal and to output the delayed first gain cycle clock signal;

the fourth plurality of NOR gates comprises a twelfth NOR gate coupled to the output of the fourth NOR gate and configured to receive the delayed second sampling cycle clock signal and the delayed first gain cycle clock signal and to output the second gain cycle clock signal, a thirteenth NOR gate configured to receive the first trigger signal and the second gain cycle clock signal and configured with an output terminal, a fourteenth NOR gate coupled to the output terminal of the thirteenth NOR gate and configured to receive the delayed first gain cycle clock signal and to output the delayed second gain cycle clock signal.

9. The non-overlapping clock generation circuit of claim 8, wherein:

the first plurality of digital logic elements further comprises a first inverter coupled to the first plurality of NOR gates and configured to receive the delayed first sampling cycle clock signal and to output a complement signal of the delayed first sampling cycle clock signal;

the second plurality of digital logic elements further comprises a second inverter coupled to the second plurality of NOR gates and configured to receive the delayed second sampling cycle clock signal and to output a complement signal of the delayed second sampling cycle clock signal;

the third plurality of digital logic elements further comprises a third inverter coupled to the third plurality of NOR gates and configured to receive the delayed first gain cycle clock signal and to output a complement signal of the delayed first gain cycle clock signal;

the fourth plurality of digital logic elements further comprises a fourth inverter coupled to the fourth plurality of NOR gates and configured to receive the delayed second gain cycle clock signal and to output a complement signal of the delayed second gain cycle clock signal.

10. The non-overlapping clock generation circuit of claim 1, wherein:

the first clock generation branch comprises first and second outputs configured to provide the first sampling cycle clock signal and the delayed first sampling cycle clock signal to a first set of sampling cycle control switches within a stage of a pipelined analog-to-digital converter;

the second clock generation branch comprises third and fourth outputs configured to provide the second sampling cycle clock signal and the delayed second sampling cycle clock signal to a second set of sampling cycle control switches within the stage of the pipelined analog-to-digital converter;

the third clock generation branch comprises a fifth output configured to provide the delayed first gain cycle clock signal to a first set of gain cycle control switches within the stage of the pipelined analog-to-digital converter; and the fourth clock generation branch comprises a sixth output configured to provide the delayed second gain cycle clock signal to a second set of gain cycle control switches within the stage of the pipelined analog-to-digital converter.

11. The non-overlapping clock generation circuit of claim 1, wherein the main clock signal, the inverted main clock signal, the first and second sampling cycle clock signals, the delayed first and second sampling cycle clock signals, the first and second gain cycle clock signals, and the delayed first and second gain cycle clock signals are periodic signals comprising a plurality of pulses, wherein:

responsive to a rising edge of a first main clock signal pulse, the non-overlapping clock generation circuit is configured to generate a falling edge of a first pulse of the first sampling cycle clock signal, followed by a falling edge of a first pulse of the delayed first sampling cycle clock signal, followed by a falling edge of a first pulse of the second gain cycle clock signal, followed by a falling edge of a first pulse of the delayed second gain cycle clock signal, followed by a rising edge of a first pulse of the first gain cycle clock signal and a rising edge of a first pulse of the delayed first gain cycle clock signal; and responsive to a rising edge of a second main clock signal pulse that immediately succeeds the first main clock signal pulse, the non-overlapping clock generation circuit is configured to generate a falling edge of a first pulse of the second sampling cycle clock signal, followed by a falling edge of a first pulse of the delayed second sampling cycle clock signal, followed by a falling edge of the first pulse of the first gain cycle clock signal, followed by a falling edge of the first pulse of the delayed first gain cycle clock signal, followed by a rising edge of a second pulse of the second gain cycle clock signal and a rising edge of a second pulse of the delayed second gain cycle clock signal, wherein the first pulse of the second gain cycle clock signal immediately precedes the second pulse of the second gain cycle clock signal, and the first pulse of the delayed second gain cycle clock signal immediately precedes the second pulse of the delayed second gain cycle clock signal.

12. A non-overlapping clock generator circuit comprising:

a first frequency divider circuit configured to receive a main clock signal and to responsively output first and second trigger signals;

a second frequency divider circuit configured to receive an inverse of the main clock signal and to responsively output third and fourth trigger signals;

a first clock generation branch comprising first, second, third, and fourth NOR logic gates configured to receive the first, second and fourth trigger signals and to responsively generate a first sampling cycle clock signal and a delayed first sampling cycle clock signal;

a second clock generation branch coupled to the first clock generation branch, the second clock generation branch comprising fifth, sixth, seventh, and eighth NOR logic gates configured to receive the first, second and third trigger signals and to responsively generate a second sampling cycle clock signal and a delayed second sampling cycle clock signal, wherein the first sampling cycle clock signal and the delayed first sampling cycle clock signal are non-overlapping with the second sampling cycle clock signal and the delayed second sampling cycle clock signal;

a third clock generation branch coupled to the first and second clock generation branches, the third clock generation branch comprising ninth, tenth, and eleventh NOR logic gates configured to receive the second trigger signal and to responsively generate a first gain cycle clock signal and a delayed first gain cycle clock signal; and a fourth clock generation branch coupled to the first, second, and third clock generation branches and comprising twelfth, thirteenth, and fourteenth NOR logic gates configured to receive the first trigger signal and to responsively generate a second gain cycle clock signal and a delayed second gain cycle clock signal, wherein the first gain cycle clock signal and the delayed first gain cycle clock signal are non-overlapping with the second gain cycle clock signal and the delayed second gain cycle clock signal;

wherein the first NOR gate is configured to receive the second and fourth trigger signals and to output the first sampling cycle clock signal;

wherein the second NOR gate is configured to receive the first sampling cycle clock signal and the first trigger signal and configured with an output terminal;

wherein the third NOR gate is coupled to the output terminal of the second NOR gate and configured to receive the fourth trigger signal and to output the delayed first sampling cycle clock signal;

wherein the fourth NOR gate is configured to receive the delayed first sampling cycle clock signal, the first trigger signal and the delayed second sampling cycle clock signal and configured with an output terminal;

wherein the fifth NOR gate is configured to receive the first and third trigger signals and to output the second sampling cycle clock signal;

wherein the sixth NOR gate is configured to receive the second sampling cycle clock signal and the second trigger signal and configured with an output terminal;

wherein the seventh NOR gate is coupled to the output terminal of the sixth NOR gate and configured to receive the third trigger signal and to output the delayed second sampling cycle clock signal;

wherein the eighth NOR gate is configured to receive the delayed first sampling cycle clock signal, the delayed second sampling cycle clock signal, and the second trigger signal and configured with an output terminal;

wherein the ninth NOR gate is coupled to the output of the eighth NOR gate and configured to receive the delayed first sampling cycle clock signal and the delayed second gain cycle clock signal and to output the first gain cycle clock signal;

wherein the tenth NOR gate is configured to receive the first gain cycle clock signal and the second trigger signal and configured with an output terminal;

wherein the eleventh NOR gate is coupled to the output terminal of the tenth NOR gate and configured to receive the delayed second gain cycle clock signal and to output the delayed first gain cycle clock signal;

wherein the twelfth NOR gate is coupled to the output of the fourth NOR gate and configured to receive the delayed second sampling cycle clock signal and the delayed first gain cycle clock signal and to output the second gain cycle clock signal;

wherein the thirteenth NOR gate is configured to receive the first trigger signal and the second gain cycle clock signal and configured with an output terminal;

wherein the fourteenth NOR gate is coupled to the output terminal of the thirteenth NOR gate and configured to receive the delayed first gain cycle clock signal and to output the delayed second gain cycle clock signal.

13. The non-overlapping clock generation circuit of claim 12:

wherein the first frequency divider circuit comprises a first flip-flop configured to receive the main clock signal, to divide the main clock signal in two by frequency and to generate the first and second trigger signals each having half the frequency of the main clock signal;

wherein the second frequency divider circuit comprises a second flip-flop configured to receive the inverse of the main clock signal, to divide the inverse of the main clock signal in two by frequency and to generate the third and fourth trigger signals each having half the frequency of the inverse of the main clock signal.

14. The non-overlapping clock generation circuit of claim 13:

wherein the first clock generation branch further comprises a first inverter coupled to the third NOR logic gate and configured to generate a complementary delayed first sampling cycle clock signal;

wherein the second clock generation branch further comprises a second inverter coupled to the seventh NOR logic gate and configured to generate a complementary delayed second sampling cycle clock signal;

wherein the third clock generation branch further comprises a third inverter coupled to the eleventh NOR logic gate and configured to generate a complementary delayed first gain cycle clock signal;

wherein the fourth clock generation branch further comprises a fourth inverter coupled to the fourteenth NOR logic gate and configured to generate a complementary delayed second gain cycle clock signal.

15. A method for generating non-overlapping clocks, comprising:

generating a first sampling cycle clock signal and a delayed first sampling cycle clock signal;

generating a second sampling cycle clock signal and a delayed second sampling cycle clock signal;

generating a first gain cycle clock signal and a delayed first gain cycle clock signal;

generating a second gain cycle clock signal and a delayed second gain cycle clock signal;

wherein the first sampling cycle clock signal, the delayed first sampling cycle clock signal, the second sampling cycle clock signal, the delayed second sampling cycle clock signal, the first gain cycle clock signal, the delayed first gain cycle clock signal, the second gain cycle clock signal, and the delayed second gain cycle clock signal are each periodic signals having a frequency and comprising a plurality of pulses;

wherein each pulse of the first sampling cycle clock signal and the delayed first sampling cycle clock signal has a rising edge and a falling edge that occur between and at different times from a falling edge of pulses of the second sampling cycle clock signal and the delayed second sampling cycle clock signal and a rising edge of next pulses of the second sampling cycle clock signal and the delayed second sampling cycle clock signal;

wherein each pulse of the first gain cycle clock signal and the delayed first gain cycle clock signal has a rising edge and a falling edge that occur between and at different times from a falling edge of pulses of the second gain cycle clock signal and the delayed second gain cycle clock signal and a rising edge of next pulses of the second gain cycle clock signal and the delayed second gain cycle clock signal;

wherein on a rising edge of a pulse of a main clock signal, generating a falling edge of a pulse of the first sampling cycle clock signal, followed by a falling edge of a pulse of the delayed first sampling cycle clock signal, followed by a falling edge of a pulse of the second gain cycle clock signal, followed by a falling edge of a pulse of the delayed second gain cycle clock signal, followed by a rising edge of a pulse of the first gain cycle clock signal and a rising edge of a pulse of the delayed first gain cycle clock signal;

wherein on a rising edge of a next pulse of the main clock signal, generating a falling edge of a pulse of the second sampling cycle clock signal, followed by a falling edge of a pulse of the delayed second sampling cycle clock signal, followed by a falling edge of the pulse of the first gain cycle clock signal, followed by a falling edge of the pulse of the delayed first gain cycle clock signal, followed by a rising edge of a next pulse of the second gain cycle clock signal and a rising edge of a next pulse of the delayed second gain cycle clock signal.

16. The method of claim 15, wherein the frequency of the first sampling cycle clock signal, the delayed first sampling cycle clock signal, the second sampling cycle clock signal, the delayed second sampling cycle clock signal, the first gain cycle clock signal, the delayed first gain cycle clock signal, the second gain cycle clock signal, and the delayed second gain cycle clock signal are a fraction of the frequency of the main clock signal and the inverted main clock signal.

17. The method of claim 16, wherein the fraction is half.

18. The method of claim 16 further comprising:

providing the first sampling cycle clock signal and the delayed first sampling cycle clock signal to a set of sampling cycle control switches of a first switched capacitor circuit within a middle stage of an analog-to-digital converter;

providing the second sampling cycle clock signal and the delayed second sampling cycle clock signal to a set of sampling cycle control switches of a second switched capacitor circuit within the middle stage of the analog-to-digital converter;

providing the delayed first gain cycle clock signal to a set of gain cycle control switches of the first switched capacitor circuit and providing the delayed second gain cycle clock signal to a set of gain cycle control switches of the second switched capacitor circuit to control an output of a middle stage residual voltage, from the middle stage, at an output frequency.

19. The method of claim 18:

wherein timing of the first and second sampling cycle clock signals relates to timing of a primary clock signal having the same frequency as the main clock signal, wherein the primary clock signal is provided to a set of gain cycle control switches within an initial stage of the analog-to-digital converter and controls an output of an initial stage residual voltage, from the initial stage, at an output frequency, wherein one pulse of each of the first and second sampling cycle clock signals are generated for every two pulses of the primary clock signal;

wherein the first and second gain cycle clock signals are timed such that the output frequency of the middle stage residual voltage is the same as the output frequency of the initial stage residual voltage.

20. The method of claim 15 further comprising:

generating first and second trigger signals from the main clock signal;

generating third and fourth trigger signals from an inverted main clock signal;

wherein the first sampling cycle clock signal and the delayed first sampling cycle clock signal are generated using the first, second and fourth trigger signals;

wherein the second sampling cycle clock signal and the delayed second sampling cycle clock signal are generated using the first, second and third trigger signals;

wherein the first gain cycle clock signal and the delayed first gain cycle clock signal are generated using the second trigger signal;

wherein the second gain cycle clock signal and the delayed second gain cycle clock signal are generated using the first trigger signal.

* * * * *